US012286343B1

United States Patent
Staton et al.

(10) Patent No.: US 12,286,343 B1
(45) Date of Patent: Apr. 29, 2025

(54) SYSTEM FOR CONTROLLING THE APPLICATION OF ENERGY TO A CONSTRUCTION COMPONENT

(71) Applicant: NEWTONOID TECHNOLOGIES, L.L.C., Liberty, MO (US)

(72) Inventors: Fielding B. Staton, Liberty, MO (US); David Strumpf, Columbia, MO (US)

(73) Assignee: Newtonoid Technologies, L.L.C., Liberty, MO (US)

( * ) Notice: Subject to any disclaimer, the term of this patent is extended or adjusted under 35 U.S.C. 154(b) by 940 days.

(21) Appl. No.: 17/114,265

(22) Filed: Dec. 7, 2020

Related U.S. Application Data

(63) Continuation of application No. 15/858,321, filed on Dec. 29, 2017, now abandoned.
(Continued)

(51) Int. Cl.
*B81B 7/04* (2006.01)
*B23Q 11/00* (2006.01)
(Continued)

(52) U.S. Cl.
CPC ............ *B81B 7/04* (2013.01); *B23Q 11/0032* (2013.01); *B81B 7/0029* (2013.01); *E04H 9/00* (2013.01);
(Continued)

(58) Field of Classification Search
CPC ..... B81B 7/04; B81B 7/0029; B81B 2201/02; B81B 2201/03; B23Q 11/0032;
(Continued)

(56) References Cited

U.S. PATENT DOCUMENTS 1,610,578 A * 12/1926 Murphy ................ E04B 2/7411
52/480
4,110,948 A * 9/1978 Maier, Jr. .............. E04D 13/165
52/489.1
(Continued)

FOREIGN PATENT DOCUMENTS

WO  WO-2005031080 A1 * 4/2005 ............... E04B 1/82

OTHER PUBLICATIONS

Phys.Org, New Polymer That Changes Color Instantly in Response to External Magnetic Field (w/ Video), https://phys.org/news/2009-06-polymer-instantly-response-external-magnetic.html, dated Jun. 16, 2009, 4 pages.
(Continued)

*Primary Examiner* — Basil S Katcheves
*Assistant Examiner* — Daniel J Kenny
(74) *Attorney, Agent, or Firm* — AVEK IP, LLC

(57) ABSTRACT

A construction component for detecting the application of energy and responding to the energy input wherein a plurality of particles are distributed throughout the component with each particle being configured to sense component state information. The component includes at least one processor configured to receive sensing information from the plurality of particle sensors. The processor configured to receive component state information and to process the information to determine a response to selectively alter attributes of the construction component to affect the behavior of the component. The plurality of particles capable of converting a portion of the energy applied to the construction component into an alternative form of energy, wherein the converted energy is harvested for utilization elsewhere.

18 Claims, 18 Drawing Sheets

Related U.S. Application Data

(60) Provisional application No. 62/443,277, filed on Jan. 6, 2017, provisional application No. 62/441,127, filed on Dec. 30, 2016.

(51) Int. Cl.
  *B81B 7/00* (2006.01)
  *E04H 9/00* (2006.01)
  *E04H 9/14* (2006.01)
  *G01K 7/22* (2006.01)

(52) U.S. Cl.
  CPC ............... *E04H 9/14* (2013.01); *G01K 7/22* (2013.01); *B81B 2201/02* (2013.01); *B81B 2201/03* (2013.01)

(58) Field of Classification Search
  CPC .... E04H 9/00; E04H 9/14; G01K 7/22; E04B 2001/8272; E04B 1/82; E04B 2/7409; E04F 13/0805; E04F 15/20
  See application file for complete search history.

(56) References Cited

U.S. PATENT DOCUMENTS

| | | | |
|---|---|---|---|
| 4,860,851 A | | 8/1989 | Krevor et al. |
| 5,666,775 A | * | 9/1997 | Shreiner ............... E04B 1/6803 52/573.1 |
| 6,115,981 A | * | 9/2000 | Counihan ............... E04F 15/22 52/489.1 |
| 7,895,803 B2 | * | 3/2011 | Downey ............... F16F 1/373 248/610 |
| 8,511,004 B2 | * | 8/2013 | Hubbard .............. H05K 7/1495 52/167.6 |
| 9,371,669 B2 | | 6/2016 | Berg et al. |
| 2005/0224659 A1 | | 10/2005 | Pitt |
| 2007/0138583 A1 | | 6/2007 | Ofek et al. |
| 2008/0017780 A1 | * | 1/2008 | Downey ................ F16F 1/376 248/610 |
| 2008/0086966 A1 | * | 4/2008 | Stevens ............... F16F 1/3732 52/347 |
| 2008/0139722 A1 | | 6/2008 | Shefelbine et al. |
| 2009/0050428 A1 | | 2/2009 | Kloucek et al. |
| 2009/0326140 A1 | | 12/2009 | Shimada et al. |
| 2010/0089772 A1 | | 4/2010 | Deshusses et al. |
| 2010/0108306 A1 | | 5/2010 | Cooper |
| 2011/0051775 A1 | | 3/2011 | Ivanov |
| 2011/0062820 A1 | | 3/2011 | Aoyagi |
| 2011/0171137 A1 | | 7/2011 | Patolsky |
| 2013/0327928 A1 | | 12/2013 | Leach |
| 2013/0328440 A1 | | 12/2013 | Kornbluh |
| 2014/0266967 A1 | | 9/2014 | Ramahi |
| 2016/0040743 A1 | | 2/2016 | Staton |
| 2016/0363727 A1 | | 12/2016 | Suntsova |

OTHER PUBLICATIONS

Tomicek et al. Vibration-Powered Wireless Sensor for Structural Monitoring During Earthquakes. The 6th International Conference on Structural Health Monitoring of Intelligent Infrastructure, Dec. 11, 2013 (retrieved on Feb. 25, 2018) Retrieved from the Internet: <URL: https://ecs.victoria.ac.nz/foswiki/pub/Groups/WiNe/ResearchPublications/1215_VUWSeah_v3-1.pdf> entire document.

PCT Application No. PCT/US2017/068928, International Search Report and Written Opinion, dated Mar. 26, 2018, 10 pages.

* cited by examiner

SYSTEM FOR CONTROLLING THE APPLICATION OF ENERGY TO A CONSTRUCTION COMPONENT

CROSS-REFERENCE TO RELATED APPLICATIONS

This application is a continuation of U.S. patent application Ser. No. 15/858,321, filed Dec. 29, 2017, which claims priority to U.S. Provisional Patent Application No. 62/441,127, filed Dec. 30, 2016, and U.S. Provisional Patent Application No. 62/443,277, filed Jan. 6, 2017, the disclosures of each of which are incorporated by reference herein in its entirety.

BACKGROUND

Today's residential, commercial and industrial structures are complex integrated and comprehensively controlled on many levels. Building management systems are well known and broadly implemented for creating a method of controlling, monitoring, and optimizing utilities such as heating, ventilating, air-conditioning, lighting, fire systems, and security systems. The building management system is also able to communicate to third party systems such as chillers, boilers, air handling systems, energy metering systems and other energy management systems, access control systems, fire-life safety systems, and other building management related devices with open interoperable communication capabilities.

An enhancement to these building management systems is the ability to control not just the traditional systems such as heating and cooling but also to be able to control the response of generally uncontrolled components to unanticipated energy inputs, such as outside noise, the energy of hail applied to a roofing system, or the energy application a foundation experiences during an earthquake.

Structural materials can absorb energy, attenuating some energy and passing some energy along to either the environment or associated structural features. Large amounts of energy from a source such as hail, earthquakes or even loud noises can lead to damage or disintegration of structural components or potentially the entire structure. Concentrated damage, such as cracks or delamination, can cause the structure or component to experience reduced functionality or to become fully inoperable. The disclosed technology facilitates the dissipation of energy across the components utilized by, or within, the structure and even to potentially utilize in a productive manner energy that would traditionally be harmful to the structure. An optimized component of the structure will ideally experience stress wave propagation and thereby spread the stress more evenly. The construction component may contain a sensor to assess the magnitude and frequency of the energy input, modulate it in some fashion to counteract the harmful effects of the energy input, and, if possible, harvest the energy for productive use within the construction component or utilize it at some other location.

One exemplary device that has traditionally been used in the construction industry is an isolation clip. The isolation clips allow for a wall to be separated from the framing components from a building. In order for the isolation clips to work, however, the isolation clips must be combined with a track system which essentially creates a whole separate framing system to which the wall boards are attached. These prior art systems are extremely complicated, and significant time and money is spent employing people who are skilled in the art of building these systems. Once a prior art isolation system is installed in a building, the system helps to diffuse sound that would otherwise travel through the wall. However, these systems are limited in their function based on the fact that the primary purpose of the isolation clip is to decouple the wall boards from the framing components.

It shall be appreciated from the foregoing, therefore, that construction components lacking intelligence present challenges that are in need of solutions and there is a need for components having increased flexibility for damping purposes that may be used in conditions where such damping characteristics are desirable.

SUMMARY

Construction components such as foundations, roofing and interior paneling are no longer stand-alone isolated systems that are installed without connectivity to other building components. Rather, these components are becoming increasingly interconnected and sophisticated in the use of material science and distributed control systems. The construction components of today are not only highly aesthetically appealing, they must also in many cases be weather and impact resistant if exposed to the elements, long-lived to comply with warranties issued by the manufacturer, and also capable of being interconnected with smart systems for integration into a smart hierarchy. Today's systems often utilize micro-electro-mechanical systems (MEMS) or nanomaterials to address system challenges whose solutions were essentially untenable just a few years ago.

In particular, when construction components are exposed to the application of energy, and many times energy that may be detrimental to the system receiving the energy input, there must be a mechanism to intelligently address the application of that energy. Disclosed herein is a system capable of sensing an energy input to a construction component and reacting accordingly to properly manage the energy. These systems embodiments may be considered advancements in passive and dynamic modes utilizing particle impact damping (PID) techniques.

An embodiment of the disclosed system utilizes a plurality of particles distributed within, or applied to, the construction component. The particles comprise, for example, MEMS or nanomaterials, wherein the particles are programmable to sense and react to applied energy patterns. Once detected, the particles convey data detailing the parameter, or parameters of concern, such as frequency and displacement, to a processor or alternatively relying upon internal programming of the particle itself. An algorithm analyzes the data transmitted by the particles and determines an appropriate response which is then relayed back to the particles. The particles then selectively alter attributes of the construction component to effect behavior of the component in a manner desirable to the property owner or operator.

For example, a composition containing carbon nanotube (CNT) particles may be disbursed throughout the construction component or particles may alternatively be applied to one or more surfaces of the component. Once the particles receive the response processed by the algorithm, though, for example, a plurality of micro- or nano-antenna, the particles react as directed and may be capable of damping the applied energy or redirecting it in a manner that is less harmful to the structure. In addition, the particles within or applied to the construction component may also be used to convert a portion of the energy applied to the construction component into an alternative form of energy, wherein the converted energy may act to power the controlled response under the direction of the algorithm or redirects the energy elsewhere for alternative utilization, for example.

In one embodiment, a construction component utilizes three-dimensional particles dispersed therein. In a use configuration, an initial applied energy received by the construction component causes the particle to compress from a natural expanded state to a compressed state. The three-dimensional structure subsequently returns to its expanded state, thereby imparting an opposing energy on the construction component which is less than the initial applied energy received by the construction component.

In another embodiment, a damping system for reducing the effects on a construction component caused by a disruption in the environment of the construction component includes having a plurality of three-dimensional nanoparticles dispersed therein. The nanoparticles are configured to provide a controlled response to an applied energy which could be in the form of strong vibration, acoustic energy or even impacts from hail. The system further includes a sensor which measures an amplitude and frequency spectrum of the disruption. In a use configuration, the sensor determines the amplitude and frequency spectrum of the disruption received by the building component; and the applied response is dependent on the amplitude and frequency spectrum of the original energy input.

In still another embodiment, a damping system for reducing the effects on a building component caused by a disruption in the environment of the building component has particles integrated throughout or applied to the component. The particles are configured to provide a controlled response to the disruption. In a use configuration, the disruption received by the building component causes the particle to oscillate between a first and second position, which causes an opposing force on the building component which is less than the energy originally applied to the building component. The opposing force acts to reduce the effects of the disruption.

DETAILED DESCRIPTION

The following discussion is directed to various embodiments of construction components incorporating sensing and controlled response technology and while some embodiments can be desirable for specific uses, the disclosed embodiments should not be interpreted or otherwise considered to limit the scope of the invention, as claimed below. In addition, one skilled in the art will understand that the following disclosure has broader application than is explicitly described with specific embodiments.

Embodiments of construction materials employing damping apparatus are described herein. As will be described in greater detail below, damping apparatus may take a variety of configurations. For purposes of describing the invention, various examples will be used to illustrate the damping apparatus and its function. However, it shall be recognized that the examples are meant to be illustrative only and shall not limit the scope of the invention described herein.

Figure 3:
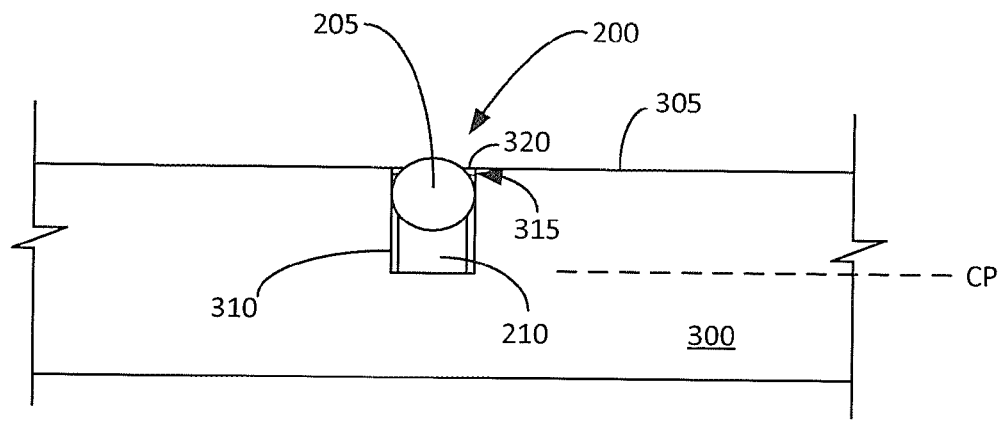
FIG. 3 is a side view of an embodiment of a construction component detailing embodiments of the present invention.

In one embodiment, illustrated in FIG. 3, various construction materials incorporate damping apparatus 200 for diffusing the impacts of an applied energy on the construction material. FIG. 3 shows the damping apparatus 200 used in connection with a joist 300 (wood, steel, aluminum, etc.) used for framing purposes, although the damping apparatus 200 may be incorporated into any of a number of different construction components. The damping apparatus 200 may include an interaction member 205 and an elastic member 210. The interaction member 205 may be disposed at least primarily inside a cavity 310, and the elastic member 210 may be similarly disposed in the cavity 310. The elastic member 210 may be configured to urge the interaction member 205 away from the cavity 310. The elastic member 210 may be a helical spring although other types of resilient elastic components may alternately (or additionally) be used in different embodiments, such as a flat spring, a gas spring, a hydraulic spring, or a magnetic spring. Further, the elastic member 210 could be a foam material, or any other type of substance that exhibits elastic properties sufficient to provide damping capabilities as described herein.

In the illustrated embodiment of FIG. 3, an upper aperture 315 in the cavity 310 is smaller than the interaction member 205, such that the interaction member 205 cannot completely pass through the upper aperture 315. This may be accomplished by an endcap 320 or other means that is added to the cavity 310 to make the upper aperture 315 smaller and prevent the interaction member 205 from exiting the cavity 310.

The cavity 310 may include threading, and the endcap 320 may include complementary threading for coupling the endcap 320 to the cavity 310. The endcap 320 may further include a passage or other element for receiving a driver bit to allow the endcap 320 to be fastened to the cavity 310. Alternately, the endcap 320 may be snapped on, fused, adhered, friction fit, or otherwise attached to the cavity 310.

In one embodiment, it may be desirable for the endcap 320 to be adjustably coupled (e.g., such that it can move up and down). Such adjustment may allow an amount of force on the interaction member 205 provided by the elastic member 210 to be altered as desired. It may additionally (or alternately) be desirable for the stiffness of the elastic member 210 to be adjustable (e.g., via an adjustment mechanism, such as a screw) such that the elastic component 210 may dissipate varying degrees of applied energy, as described below.

It may be desirable for the interaction member 205 to be generally spherical to provide a single point of contact between the interaction component 205 and a corresponding construction substrate (e.g., drywall, as described below and illustrated in FIG. 6) with which the apparatus 200 will be used. Nevertheless, it is foreseen that the interaction member 205 may be configured to be shaped differently and the upper aperture 315 may be shaped complementary to the configuration of the interaction member 205.

Figure 4:
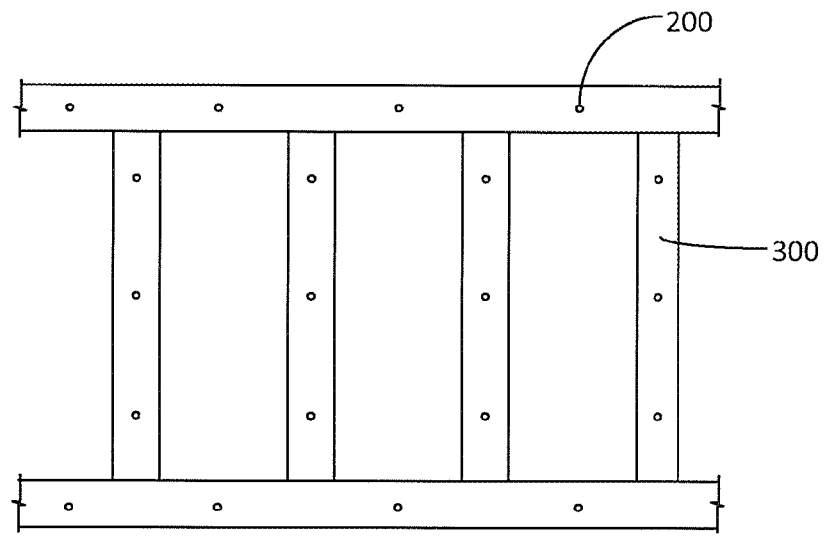
FIG. 4 is a perspective view of construction components having a plurality of damping apparatus attached thereto.

The damping apparatus 200 may be positioned in a cavity 310 defined into the joist 300. The cavity 310 may be situated anywhere on the joist 300, and in one embodiment, multiple damping apparatus 200 may be situated along the joist 300. For example, FIG. 4 illustrates a portion of a frame having multiple joists 300. The joists 300 each have a plurality of damping apparatus 200 situated therein. It may be preferable for the damping apparatus 200 to be positioned such that the interaction member 205 is biased away from the center point CP (FIG. 3) of the joist 300.

The interaction member 205 may extend only slightly beyond an outer face 305 of the joist 300. With the damping apparatus 200 in place, dry wall may be attached to the joists 300 in a known manner, with care being taken to avoid collisions between fastening mechanisms and the damping apparatus 200. When the drywall is attached to the joists 300, a portion of the drywall may come into contact with the interaction member 205.

In use, the damping apparatus 200 acts to diffuse impacts of energy received by the surface employing the damping apparatus 200. Continuing with the example of joists and drywall, the elastic member 210 biases the interaction member 205 toward the aperture 315, and the interaction member 205 extends partially through the aperture 315 and contacts the drywall. When an applied energy or force is received by the drywall, for example, as a result of a physical impact with the wall, a movement of the wall due to natural forces such as earthquakes, or even sound wave impacts, the impact may cause the interaction member 205 to press against the elastic member 210, causing the elastic member 210 to compress. It shall be noted that the elastic member 210 may be compressed a small degree or a large degree, depending on the strength of the applied energy. For example, upon receipt of applied energy in the form of sound waves, the degree of compression of the elastic member 210 may be minimal as compared to the degree of compression of the elastic member 210 when the applied energy is in the form of a physical impact.

When the elastic member 210 compresses, a portion of the applied energy is absorbed by the elastic member 210. As the elastic member 210 returns to its initial position (e.g., as a result of its elastic properties), the elastic member 210 exerts an opposing force on the interaction member 205 which is subsequently transferred back to the drywall surface. However, the opposing force transferred back to the drywall surface is less than the applied energy that was initially received by the drywall surface. This may be due to inefficiencies in the elastic member 210, for example, which prevents all of the applied energy from being transferred back to the drywall surface. In this way, the applied energy that is received by the joist 300 may be decreased.

To further dissipate the applied energy and reduce movement of the interaction member 205, a cushion may be placed in the cavity 310 (e.g., on an underside of the endcap 320). In such embodiments, the cushion may be made from a material such that it is initially compressed when the interaction member 205 is in its initial position (e.g., contacting a drywall surface). Upon movement of the interaction member 205 away from the aperture 315 (and the cushion) as a result of an applied force, the cushion will expand. The cushion may then absorb some force from the interaction member 205 when the interaction member 205 is returned to its original position, causing the cushion to return to the compressed configuration. The cushion may be constructed of, for example, open celled polyurethane, and fast-recovery memory foam may be particularly useful. Those skilled in the art will appreciate that other materials which may quickly return to their original configuration after being compressed may similarly be used.

The resulting benefits of the use of the damping apparatus 200 may be numerous. For example, it may be possible to prevent damage to the drywall (e.g., denting, holes, etc.) as a result of physical impacts due to irreverent human behavior (e.g., punching a wall) or accidental impacts (e.g., hitting the wall with a car). Further, it may be possible to design rooms having greatly increased acoustics by diffusing at least a portion of outside noises.

Figure 5:
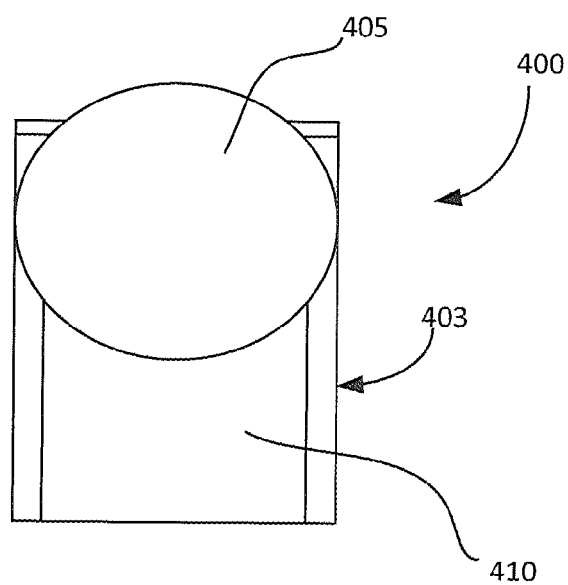
FIG. 5 is a side view of an embodiment of a damping apparatus for implementation into various construction components.

In another embodiment, shown in FIG. 5, a damping apparatus 400 is substantially similar to embodiment 200, but may further include a seat 403. The seat 403 may generally function for the same purposes as the cavity 310 (e.g., to provide a means for holding means the interaction member 405 and the elastic member 410 together). The damping apparatus 400 may be beneficial for incorporation onto a construction material. For example, in FIG. 6, the damping apparatus is shown in use with dry wall 350. However, the damping apparatus 400 may also be utilized as described above (e.g., with the damping apparatus 400 fitting into the cavity 310).

Figure 13A:
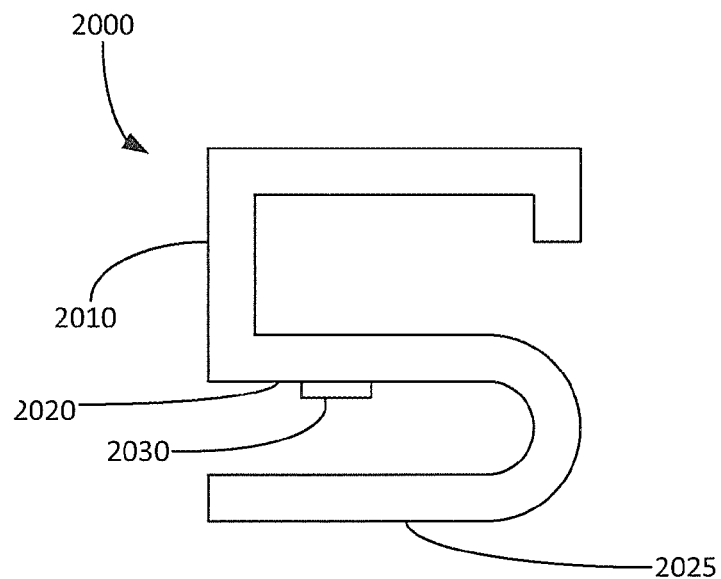
FIG. 13A is a perspective view of an isolation clip according to an embodiment of the invention.
Figure 13B:
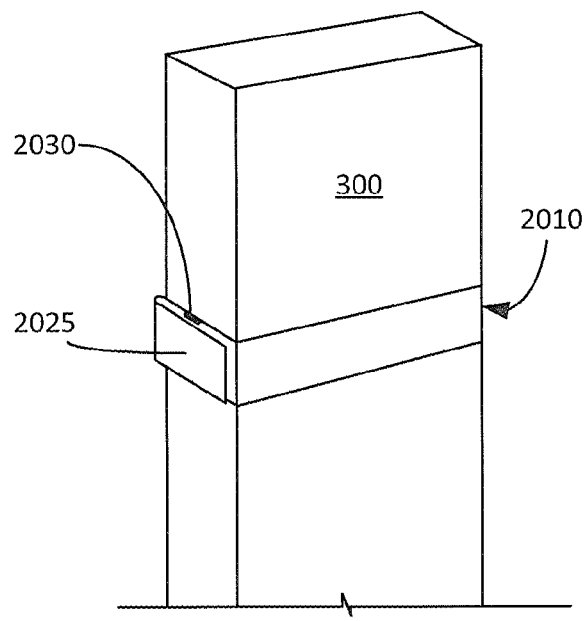
FIG. 13B is a perspective view of the isolation clip of FIG. 13A shown in a use configuration.

While the damping apparatus 200 and 400 are described above in use with wall joists 300 used in walls, it shall be understood that the apparatus 200 and 400 may also be utilized in conjunction with other construction materials, such as floor joists and/or panels, insulation panels, windows (e.g., around the outer perimeter of the frame or secured on or between glass panes), etc. Additionally, the damping apparatus may be incorporated into devices configured to work with construction materials. For example, isolation clips 2010, such as that shown in FIG. 13A are commonly used to provide a space between a wall panel and the joists. The isolation clips 2010 may be effective to dampen some amount of applied energy. However, the dampening capabilities may be somewhat limited. In one embodiment 2000, apparatus for damping or dispersing applied energy 2030, such as apparatus 400 described above, may be incorporated into or on isolation clips 2010 to provide further dampening capabilities. For purposes of discussion, the damping apparatus 2030 is substantially similar to damping apparatus 400, although it shall be understood that other damping apparatus (e.g., 300, or the compositions described below) may alternately or additionally be incorporated into use with the isolation clip 2010 for damping purposes. For example, the damping apparatus may be used to alter the fundamental frequency (e.g., peak amplitude) waveform characteristics received by the isolation clip 2010 which in turn may alter the resonant frequency of the overall wall panel and joists. These techniques can reduce vibration, buzzing, thumping, and provide enhanced attenuation to undesirable noise transfer.

Here, the apparatus 400 may be secured to or incorporated into a contact surface 2020 of the isolation clip 2010. The isolation clip 2010 may be secured to a joist 300 and corresponding wall panel according to known methods. When an applied energy is received by a wall panel (e.g., a physical force), the energy may cause a flexible portion 2025 of the isolation clip 2020 to flex in the direction of the surface 2020. The flexible portion 2025 may come into contact with the damping apparatus 2030, which may cause the interaction member 405 to move, thereby exerting a force on the elastic member 410, causing the elastic member 410 to compress. The damping apparatus 2030 thus dampens or disperses some of the applied energy as described above.

Figure 16:
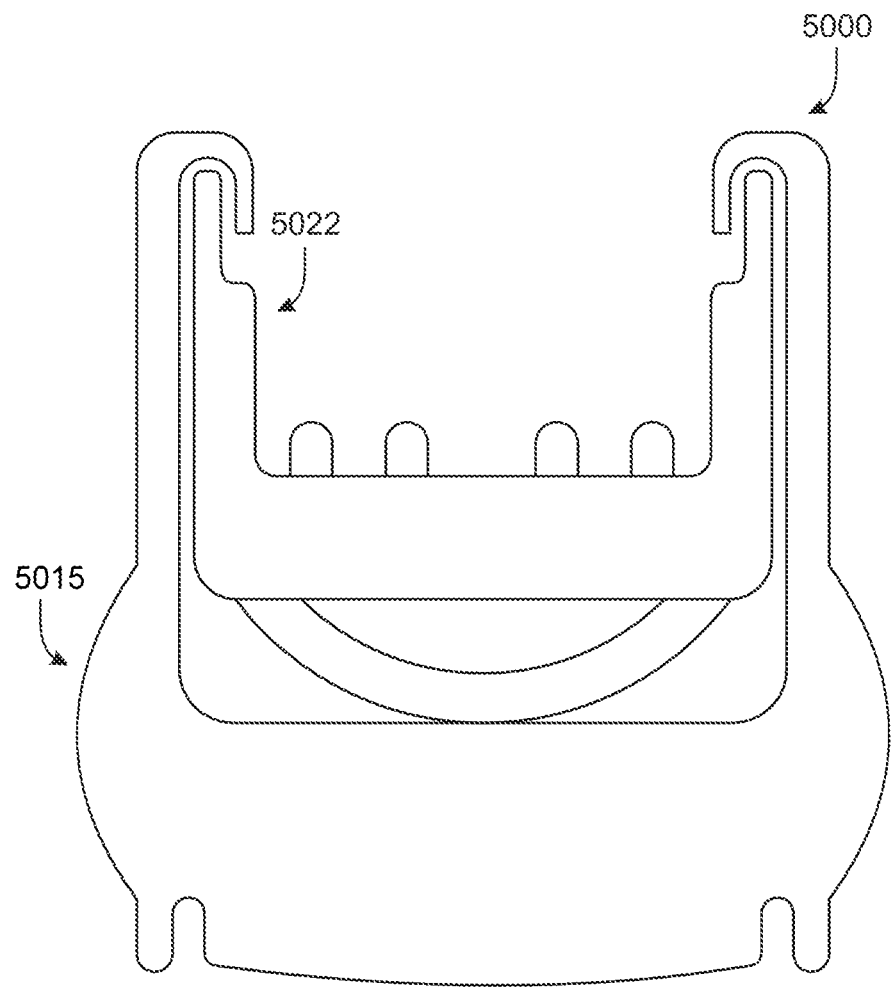
FIG. 16 is a top view of an isolation clip system according to another embodiment of the invention.
Figure 17:
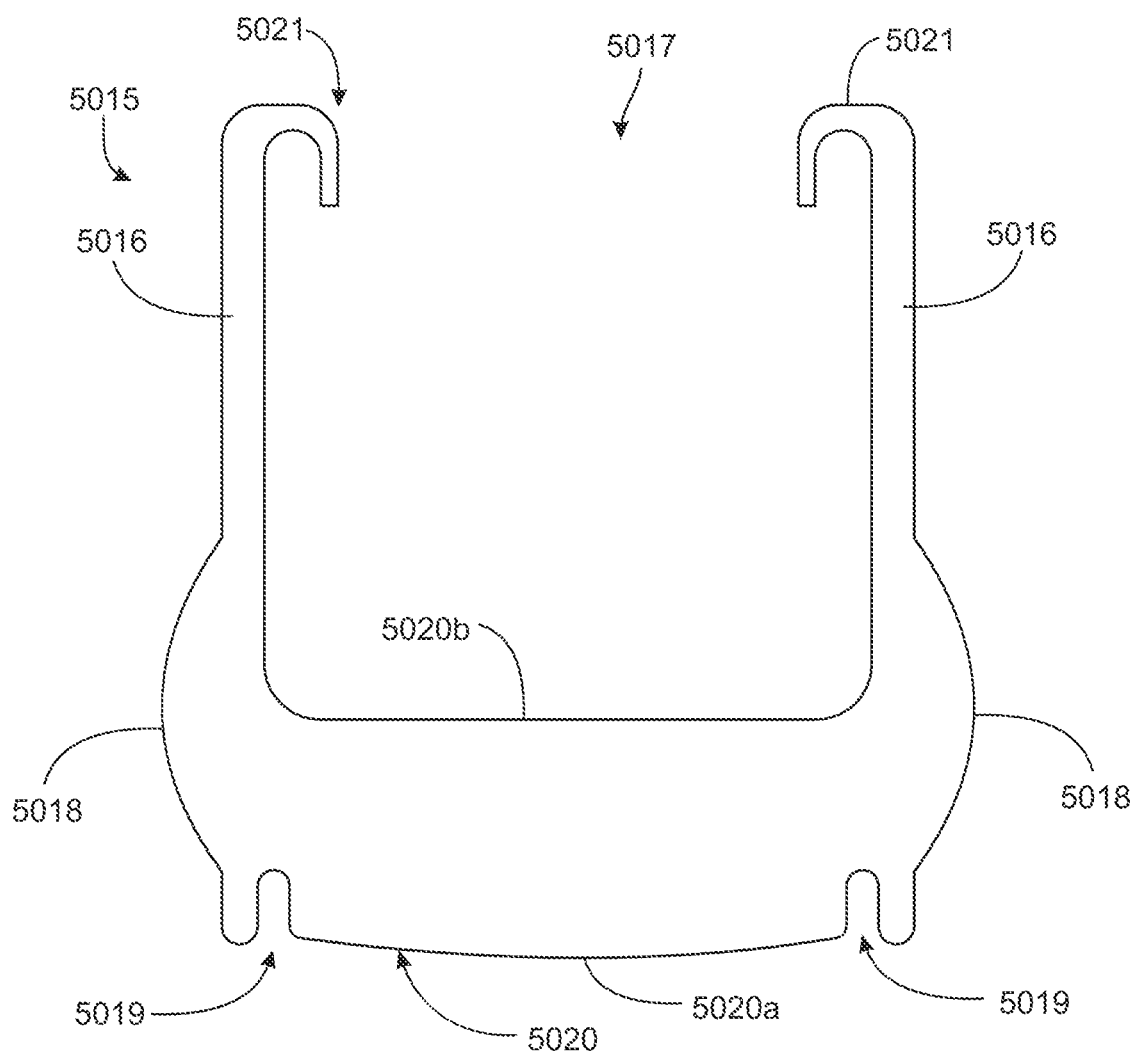
FIG. 17 is a top view of a portion of the isolation clip system of FIG. 16.

In another embodiment, illustrated in FIG. 16, an isolation clip 5000 includes an outer bracket 5015 and an inner bracket 5022. As FIG. 17 illustrates, from the side, the outer bracket 5015 may be generally rectangular, having a bottom contact surface 5020 comprising a contact point 5020a and an inner contact surface 5020b. Arms 5016 extend upwardly from the contact surface 5020. The top of the outer bracket 5015 may be open to form an inner bracket channel 5017. A hook 5021 may be formed at the end of each respective arm 5016 for engaging with the inner bracket 5022. The contact surface 5020 may be slightly curved such that a single contact point 5020a contacts a substrate, as described below. Zipper channels 5019 may be formed in the contact surface 5020 for receiving insulation. Protrusions 5018 having a generally rounded configuration may extend outwardly from the arms 5016.

Figure 18:
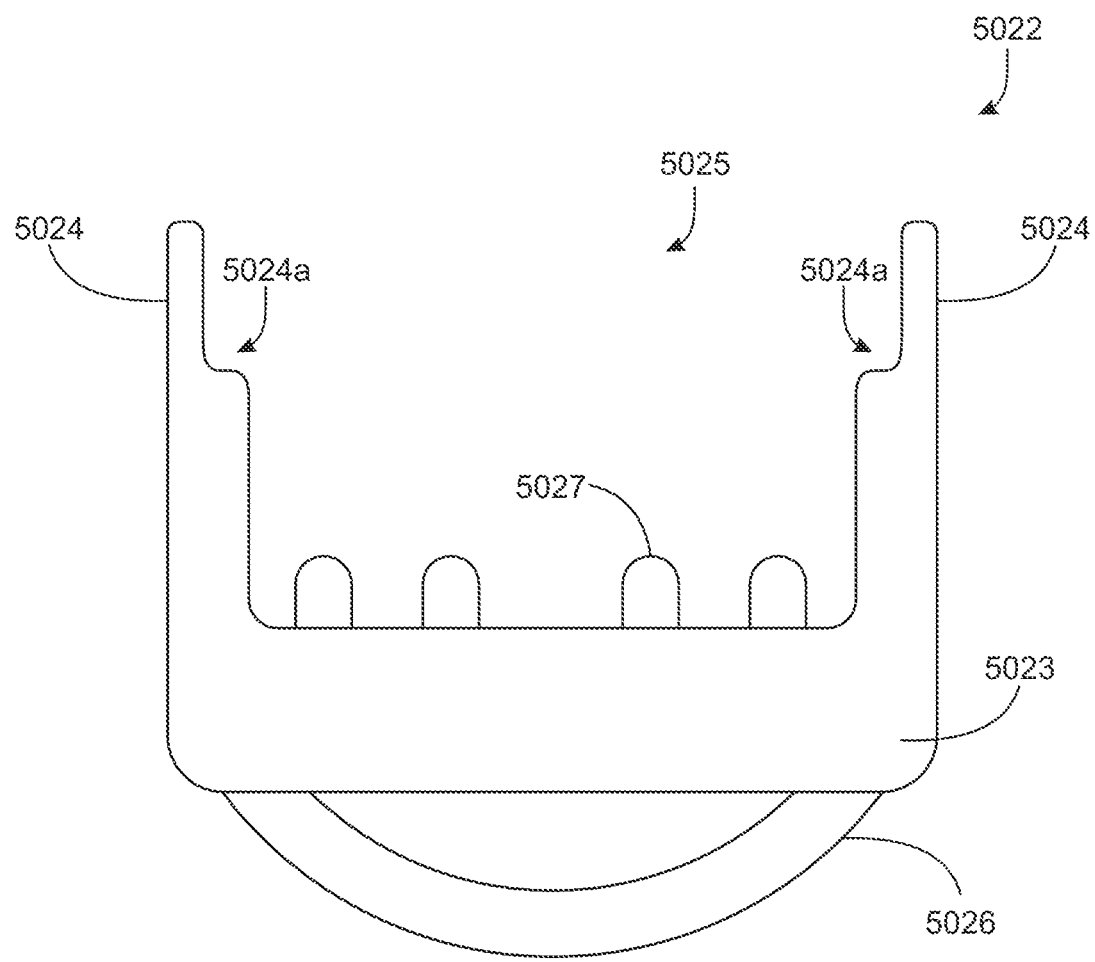
FIG. 18 is a top view of a portion of the isolation clip system of FIG. 16.

Referring now to FIG. 18, the inner bracket 5022 may also have a generally rectangular shape, and may include a bottom surface 5023 with arms 5024 extending upwardly from the bottom surface 5023. The arms 5024 may include a tapered portion 5024a, which may be configured to engage with the hooks 5021 in the outer bracket 5015. A top portion of the inner bracket 5022 may be open to form a stud channel 5025. Resilient projection members 5027 may extend from the bottom surface 5023 into the stud channel 5025. Further, a resilient member 5026 may be secured to, and extend outwardly from, the bottom surface 5023.

Figure 19:
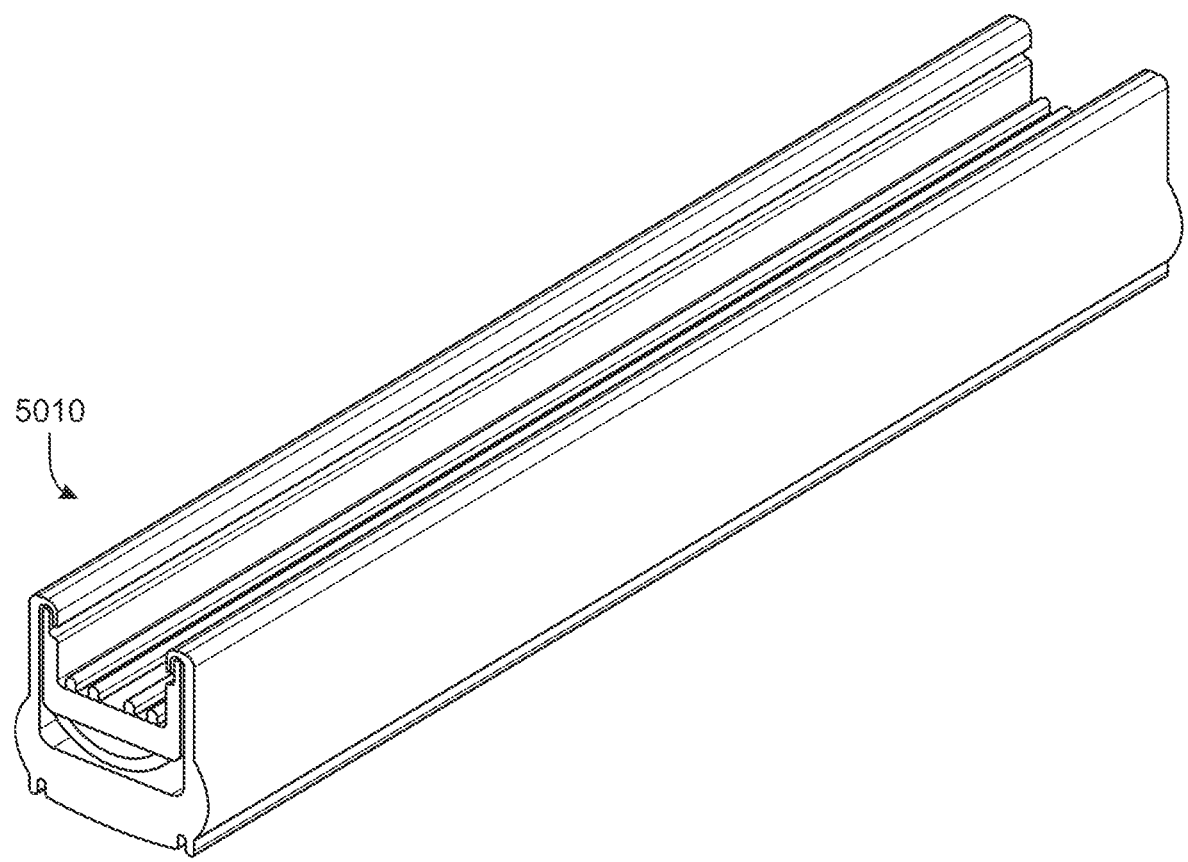
FIG. 19 is a perspective view of the isolation clip system of FIG. 16.

As shown in FIGS. 16 and 19, when the inner bracket 5022 is engaged with the outer bracket 5015, the resilient member 5026 contacts the inner contact surface 5020b. Together, the outer bracket 5015 and the inner bracket 5022 form the isolation clip 5010.

Figure 20:
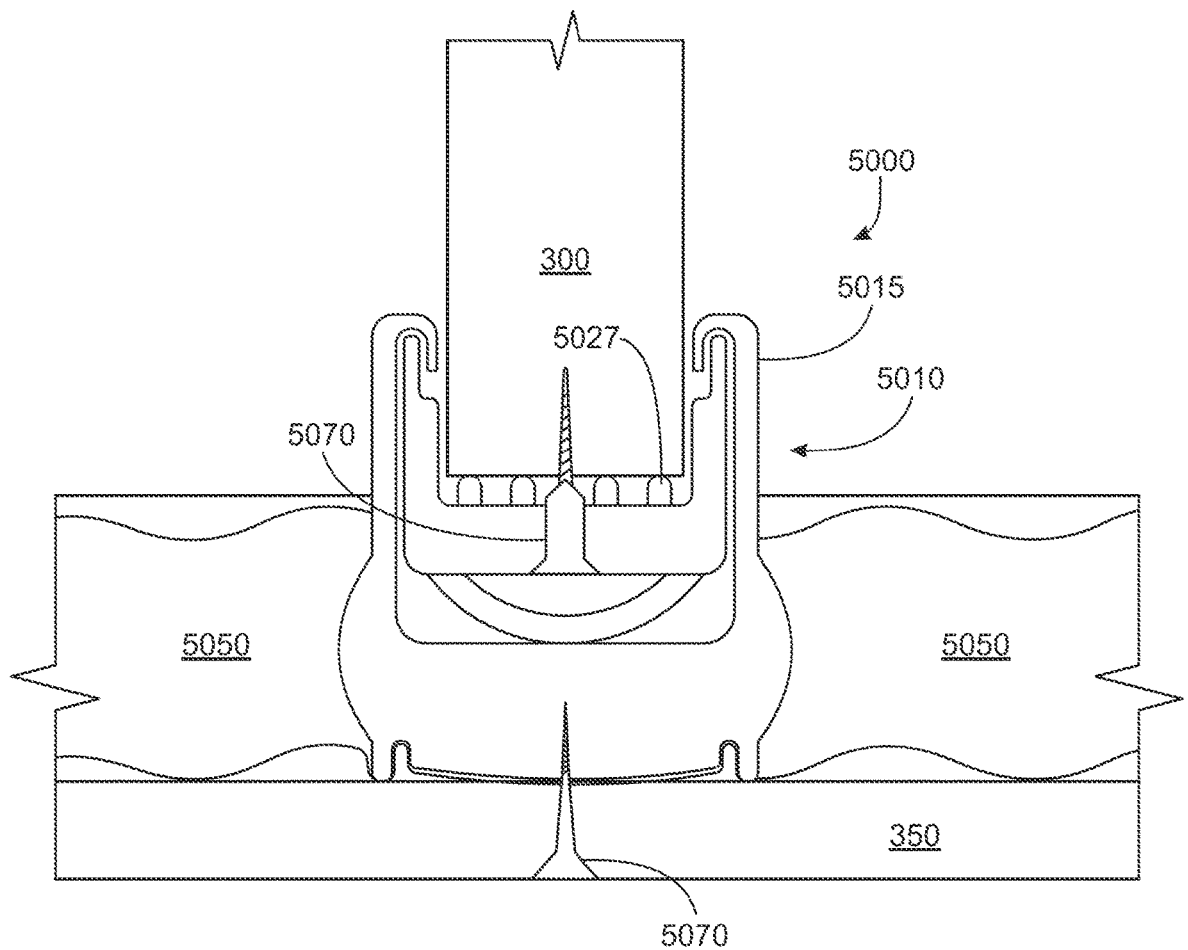
FIG. 20 is a top view of an isolation clip system in a use configuration according to another embodiment of the invention.

Moving on, FIG. 20 illustrates an embodiment of the isolation clip 5010 in use between a stud 300 and drywall 350. The stud 300 fits into the stud channel 5025, and may abut the projection members 5027. A fastening element 5070 may secure the inner bracket 5022 to the stud 300. A hole may be formed in the resilient member 5026 in order for the fastening element 5070 to pass there through to contact the bottom surface 5023. The fastening element 5070 may be countersunk into the bottom surface 5023 so as not to interfere with the resilient member 5026.

The inner bracket 5022 may be first fastened to the stud before engaging with the outer bracket 5015. Therefore, once the inner bracket 5022 is fastened to the stud 300, the outer bracket 5015 may be clipped around the inner bracket 5022 such that the hooks 5021 engage with the arms 5024 of the inner bracket 5022. The resilient member 5026 may experience a degree of compression when the outer bracket 5015 is installed onto the inner bracket 5022. Accordingly, it shall be recognized by those of skill in the art that it may be desirable for the resilient member 5026 to be formed of a material that experiences superior flexible qualities. Some materials that may be appropriate include but are not limited to rubber, foam, etc. Alternately, the resilient member 5026 may take the form of a magnet or electromagnetic element. For example, magnets having identical poles may be provided at the inner contact surface 5020b and the corresponding bottom surface 5023 of the inner bracket 5022. The magnets may thus repel the inner bracket 5022 away from the outer bracket 5015. Still in another alternative, the resilient member 5026 may be a spring, such as a helical spring, flat spring, nitinol spring, etc.

Once the outer bracket 5015 is coupled to the inner bracket 5022 (FIGS. 16 and 19), drywall 350 may be secured to the outer bracket 5015. The drywall 350 may contact the outer bracket 5015 at the contact point 5020a. A fastening element 5070 may secure the drywall 350 onto the outer bracket 5015.

It shall be understood that the inner bracket 5021 may be formed in strips having, for example, a length that corresponds to the total length of the stud 300. Alternately, the inner bracket 5021 may be provided in smaller sections which may be secured to the stud 300 at appropriate intervals (e.g., every 6", 1', 2', 3', etc.). The outer bracket 5015 may also be formed in strips corresponding to the total length of the stud 300, and/or may be provided in smaller sections. In one embodiment, it may be desirable for the inner bracket 5021 to be provided in multiple sections to be secured to the stud at desirable intervals, while the outer bracket 5015 is provided in a strip (e.g., corresponding to the length of the stud 300). The outer bracket 5015 would still clip over the inner bracket 5021 in the same manner as described above.

In one embodiment, the outer bracket 5015 and/or inner bracket 5022 may be molded or roll-formed in 8 or 9-foot strips, and then cut to the correct length dimension on-site.

In use, the isolation clip 5010 may act to decouple the drywall 350 from the stud 300. However, the resilient member 26 may allow for slight movement of the drywall 350 in response to an impact received by the drywall 350. When an impact is received, it may be at least partially transferred from the drywall 350 (and thus the outer bracket 5015) to the resilient member 5026, causing the resilient member 5026 to flex, compress, or otherwise be displaced. The resilient member 5026 may thereafter return to its original position as a result of its flexible nature. When the resilient member 5026 returns to its original position, it will impart an opposing force on the drywall 350. The opposing force may, however, be less than the impact that was initially received by the drywall 350. The isolation clip 5010 thus may be effective for diffusing, dispersing, or otherwise dissipate the impact away from the sheetrock.

It shall be understood that an impact can be any force, regardless of how strong, and may include various energy types. For example, the impact may be a sound wave, seismic waves, a physical impact, or any other type of impact. Therefore, it shall be understood that it may be desirable for the resilient member 5026 to be adjustable in order to be able to deflect various impacts. The resilient member 5026 may be manufactured having particles dispersed therein, for example, particles as described in U.S. patent application Ser. No. 15/365,923. As described therein, the particles may be altered in real time to provide a controlled response to various impacts.

Sensors may be provided at or near the area of the resilient member 5026, or at or near the drywall 350, to measure forces being received by the drywall 350. The sensors may measure the amplitude and resonant frequency (or harmonics), for example, of the wall and provide feedback to the resilient member 5026 (e.g., over a network, with each component having the necessary structure such as processors, communication devices, etc.) to change the strength of the resilient member so as to disrupt any impacts which may be at the resonant frequency in order to prevent damage to the sheetrock. It shall be understood that the sensors may additionally, or alternately, measure other impacts as well, and may signal the resilient member 5026 to respond accordingly.

The sensor(s) may be mechanical, electromechanical, electronic, passive in operation (sense only), or dynamic multi-mode active (sense/modify/resolve). Sensor elements may reside locally (e.g., in one location) and/or distributed as subsystem components in order to perform system level dynamic multi-mode active (DMMA) resolving actions. For example, a specific sensor element may become functional as a resolving actuator momentarily and be multiplexed in real time to its specified function.

Figure 21:
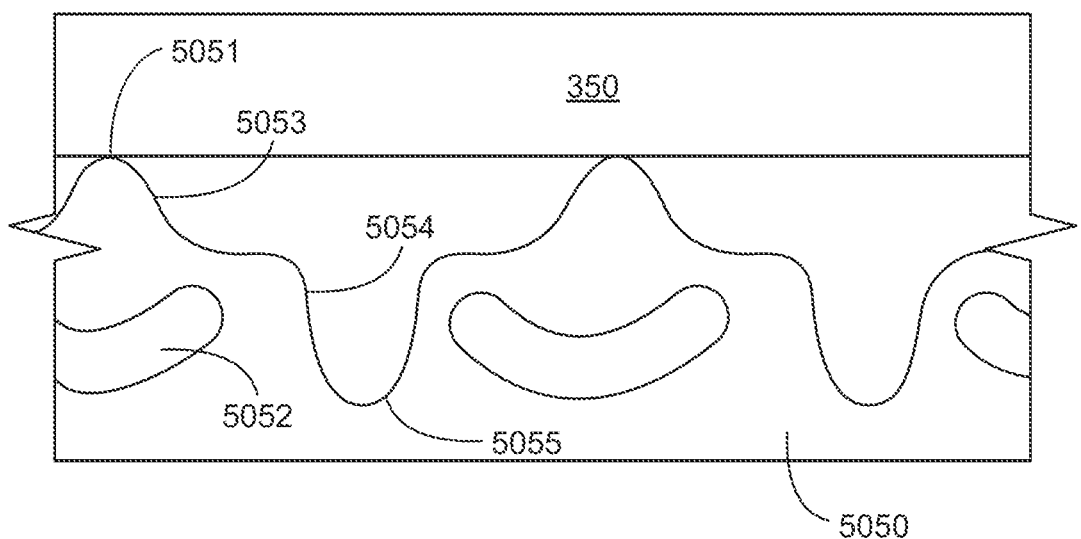
FIG. 21 is a top view of an isolation insulation system according to an embodiment of the invention.

Referring now to FIGS. 20 and 21, insulation 5050 configured for controlled-response may be provided alone or in conjunction with the isolation clip 5010. The insulation 5050 may be equipped with means for diffusing, dissipating, or otherwise dispersing forces. The insulation may be manufactured with tabs (e.g., as roughly illustrated in FIG. 20) which may engage with the zipper channels 5019 in the outer bracket 5015. The insulation 5050 may thus be installed after the outer bracket(s) 5015 are secured to the inner bracket(s) 5022, and may be installed from the top down (or bottom up), or may be otherwise installed such that the tabs in the insulation 5050 are zipped into the zipper channel 5019.

FIG. 20 shows a top view of an alternative embodiment of insulation 5050, which may take the form of a foam, for example, which may be molded to have an undulating configuration with a plurality of peaks 5051, each peak 5051 having a hole 5052 formed therein. The hole may extend from the top to the bottom of the insulation "panel" (e.g., substantially the height of the wall). The peak 5051 may form a point 5053 which may taper to sides 5054 having a wider profile than the peak, which eventually tapers to a trough 5055. The tapered nature of the peaks 5051 may result in a response force that is in a spread spectrum inverse waveform which may act to geometrically stabilize the drywall 350.

It shall be understood that the isolation system 5000 may further include or incorporate additional materials configured for controlled response, including but not limited to the damping compositions described in the '923 Application. For example, the contact surface 5020 may be coated in a damping composition which may act in conjunction with the isolation clip 5010 to further dampen, diffuse, or dissipate impacts. In combination, the isolation system may provide better impact response capabilities than an isolation clip alone.

Additionally, those of skill in the art shall understand that the isolation clip 5010 may be incorporated into various construction components or environments. For example, the isolation clip 5010 may be provided in conjunction with floor joists, ceiling joists, windows, or any other substrate, material, or component that may benefit from the ability to respond to impacts. Additionally, it may be desirable to incorporate the isolation clip 5010 into, for example, boats, which take on strong forces as a result of chopping through waves on the water.

Figure 10:
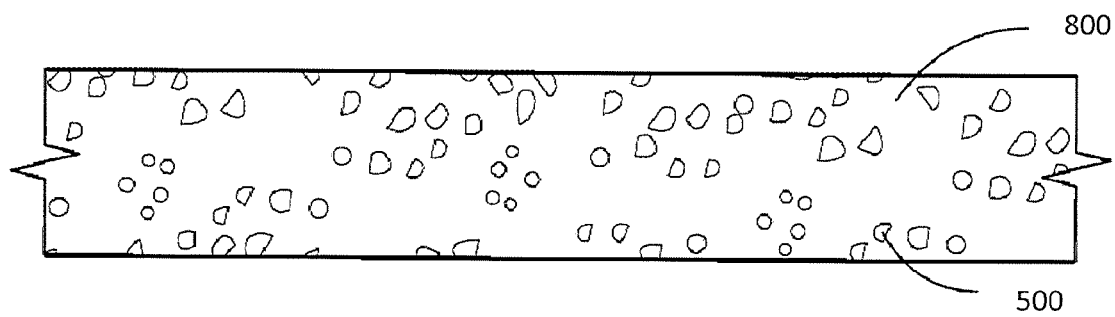
FIG. 10 is a perspective view of a composition having a plurality of damping apparatus dispersed throughout according to one embodiment of the invention.

Moving on, as briefly described above, various construction materials may be combined with three-dimensional structures (or particles) or compositions (e.g., compositions 800 shown in FIG. 10) containing such three-dimensional structures, for reducing the effect of an applied energy to or through the construction material as described in the '923 Application. A particle is a small discrete quantity of matter that interfaces with its surrounding environment. There is no rule governing how large or small an object must be to be considered a particle. Some define particles as ranging from one nanometer to one millimeter. The particles may take any of a number of configurations, such as those shown in FIGS. 7 and 8.

Figure 7:
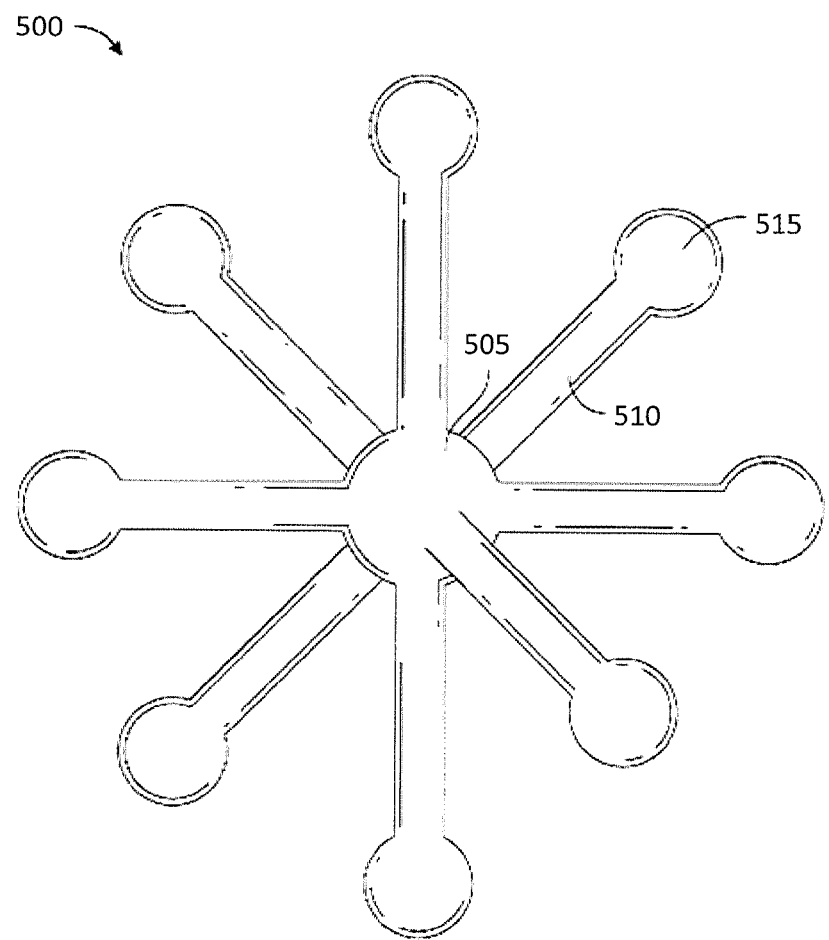
FIG. 7 is a perspective view of damping apparatus according to one embodiment of the invention.
Figure 8:
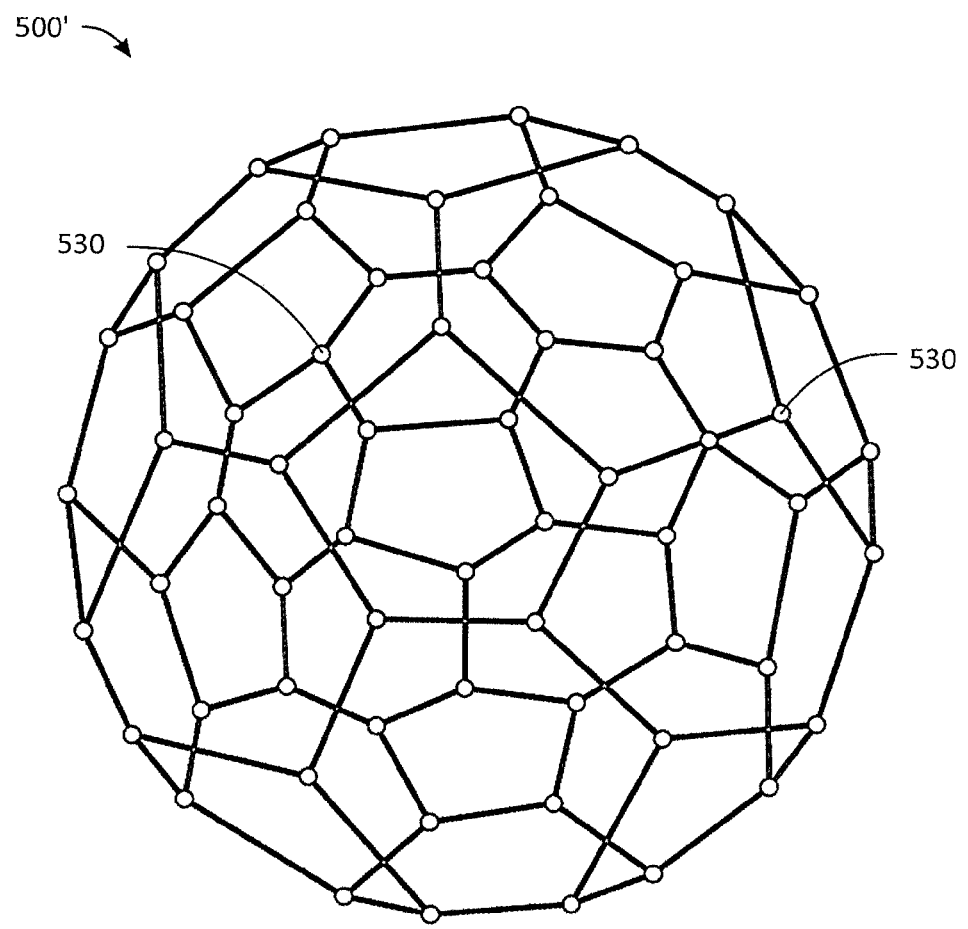
FIG. 8 is a perspective view of damping apparatus according to another embodiment of the invention.

FIGS. 7 and 8 illustrate 3D particles 500 and 500', respectively, according to embodiments of the invention. The particle 500 may include a core 505 and a plurality of spokes 510 extending radially outwardly from the core 505. The spokes 510 may extend outwardly at a variety of angles. The structure 500 may be formed of one or more materials which give the particle 500 damping characteristics. Referring to the structure in FIG. 7, the spokes 510 may optionally include interaction elements 515 which may come into contact a construction material as described below. The interaction elements 515 may be useful for expanding the surface area of the contact point between the particle 500 and construction material to ensure maximum damping effect.

The spokes 510 (and optionally the core 505 and/or interaction elements 515) may be formed from a material exhibiting superior flexibility and elasticity, such as thermoplastic polyurethanes (e.g., TPU 92A-1). Thermoplastic urethanes may exhibit durable elasticity, high resistance to dynamic loading, high abrasive resistance, quick response, and good temperature range. In one embodiment, the core 505, and optionally the interaction elements 515, may be formed of a material that exhibits greater stiffness than the spokes 510. In another embodiment, the core 505, and optionally the interaction elements 515, may be formed of a material that exhibits less stiffness than the spokes 510. In still another embodiment, the entire particle 500 is formed of the same material. It shall be understood that any 3D molecular-type structure exhibiting acceptable flexible and elastic properties may serve as the particle.

The particle 500' may be a carbon-based (or may be based on another element, such as iron, boron, aluminum, etc.) three-dimensional particle. Here, the particle 500' is shown as a fullerene molecule commonly known as buckminsterfullerene (C60-Buckyball). Other types of fullerenes, such as carbon nanotubes (CNT), graphene, icosahedral cages, etc. may be implemented into the system and are contemplated within the scope of the invention. The particle 500' may be two dimensional or three dimensional in form and may consist of layered or latticed grid structures.

Figure 9:
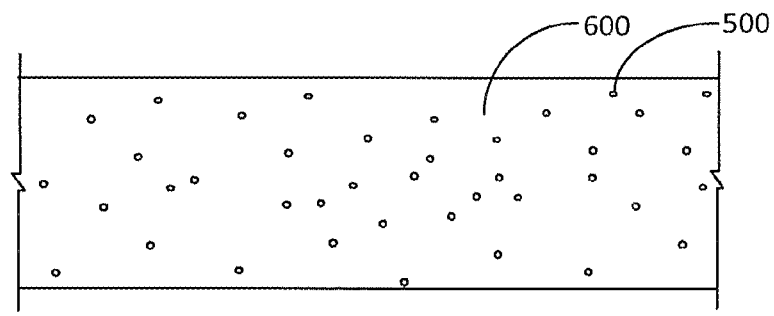
FIG. 9 is a perspective view of another embodiment of a construction component having damping apparatus dispersed throughout.

In one example of use, a plurality of particles 500 and/or 500' may be dispersed within a construction material, such as batting or blown insulation 600 (FIG. 9). The particles 500 and/or 500' may be dispersed evenly throughout the insulation as shown in FIG. 9. When the insulation is placed in the desired location, the particles may act to diffuse some of the applied energy in the manner discussed below.

When a change in the environment of the insulation occurs, e.g., due to an applied energy received by the insulation, such as sound waves travelling through a wall, the applied energy causes a change in the state of the particles 500 and/or 500' (e.g., flexion, compression, or physical displacement). As a result of this state change, some of the applied energy is transferred to the particles 500 and/or 500', thus diffusing the applied energy. The particles 500 and/or 500' may eventually return to their natural state, and in doing so, may exert an opposing applied energy. The opposing applied energy may be less than the original applied energy. However, due to the particles' 500 and/or 500' ability to diffuse some of the applied energy, the sound waves travelling through the wall may be significantly reduced. Some of the opposing energy that is not applied to the material may result in the form of frictional thermal energy while other opposing energy may shift its waveform properties changing the harmonics and therefore reducing the peak amplitude of the effective applied energy.

It shall be understood that the applied energy can be the result of any type of disturbance to the environment, including but not limited to sound waves, electromagnetic waves, seismic waves, changes in temperature and/or pressure, physical shocks, etc. In the instance of a physical shock, the applied energy received by the construction material, and thus the particles 500 and/or 500', may be substantially greater than the applied energy received as a result of sound waves. Therefore, the particles 500 and/or 500' may experience a greater degree of change in state in order to diffuse the energy from a physical shock than they would to diffuse the energy from sound waves.

Such may be the case where particles 500 and/or 500' are dispersed within insulation which may be applied to an outer surface of a building (e.g., insulation panels). The panels may experience physical impacts which may cause the particles 500 and/or 500' to temporarily flex or compress. As a result of the compression of the particles 500 and/or 500', some of the stress to the insulation panels may be diffused from the panels and transferred to the particles 500 and/or 500'. The particles 500 and/or 500' may eventually return to their natural expanded state, and in doing so, may return an opposing applied energy to the panels. The opposing applied energy returned to the panels may be less than the original applied energy. However, due to the particles' 500 and/or 500' ability to diffuse some of the applied energy from the panels, the panels may remain relatively undisturbed (e.g., experience no physical damage).

In yet another example, a composition 800 comprising a plurality of particles 500 and/or 500' dispersed therein (FIG. 10) may be applied to various building structures and/or materials. The composition may be any of a number of different compositions (which may be incorporated into a variety of different objects), including but not limited to adhesives, paints, coatings, catalysts, abrasives, cutting tools, gaskets, washers, o-rings, composite materials, ceramics and powder metallurgy. The composition 800 may be applied between layers of plywood or to ceramic shingles for the roof of a building, for example.

In one embodiment, the composition may be applied to the underside of the shingles and/or atop the shingles and the shingles applied to the roof in a known manner and according to best practices, and is further described in U.S. patent application Ser. No. 15/787,646, which is hereby incorporated by reference herein in its entirety. During a thunderstorm, the roof may experience hail, which exerts an applied energy on the shingles which, in some instances, may be sufficient that the ceramic shingles would traditionally crack. However, due to the enhanced composition 800 having damping apparatus in the form of particles 500 dispersed therein, when the shingles receive an applied energy from the hail, energy is at least partially transferred to the particles 500 such that the particles flex or compress. Here, because the energy may be greater, the particles 500 may experience a greater amount of compression. The particles 500 may then return to their natural state due to the elastic nature, which returns an opposing applied energy to the shingle(s). Having diffused some of the original applied energy, the opposing applied energy that is returned to the shingle(s) is less than the original applied energy. Accordingly, due to the transfer of energy to the particles 500, the shingle does not crack.

Figure 14:
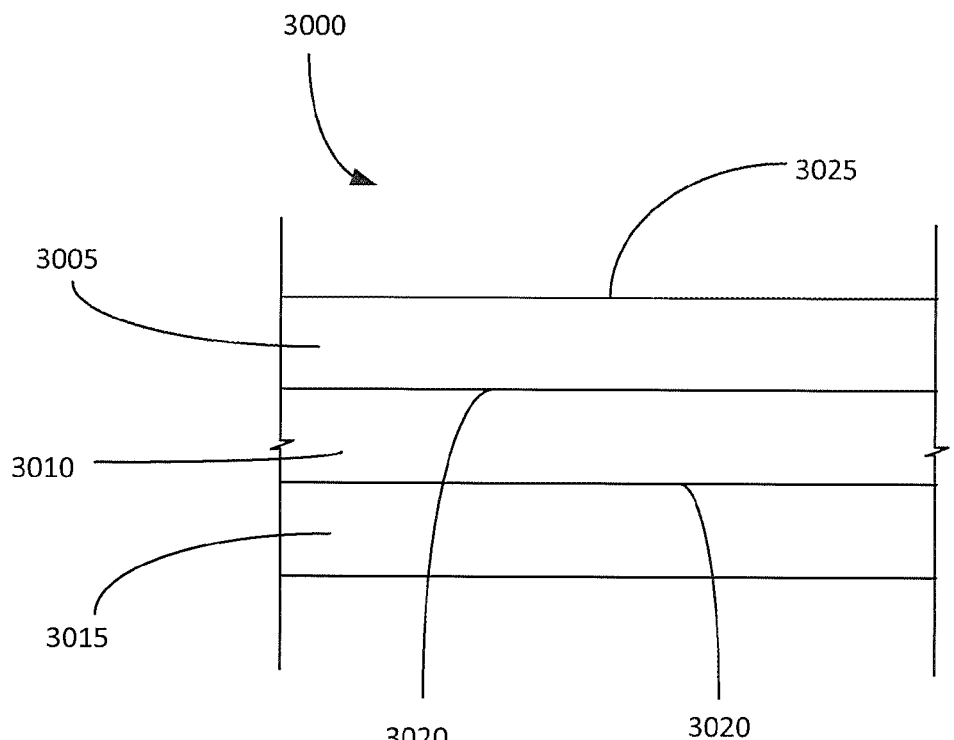
FIG. 14 is a side view of a laminate according to an embodiment of the invention.

In another embodiment, the composition 800 may be incorporated into a laminate material 3000, such as laminate flooring, or any other layered substrate (FIG. 14). The composition 800 may, for example, take the form of an adhesive and/or a coating. Particles 500 and/or 500' may be dispersed with a desired adhesive for producing the layered substrate. The adhesive may be configured to both adhere layers (e.g., 3005, 3010, and 3015) of the substrate together and to disperse impact forces as a result of the particles 500 and/or 500' (hereinafter, for purposes of discussion only, 500). The adhesive may be applied to the interface 3020 between the layers 3005, 3010, and 3015. Additionally, the composition 800 may be configured as a coating (e.g., similar to a varnish) which may be applied to a top surface 3025 of the layered substrate. In use, the particles 500 may react to changes in environment due to applied energy (e.g., a person walking on the laminate material) as described herein. The reaction may occur as a passive reaction and/or as an active response, each described in detail herein.

In still another example, the composition 800 may be used in conjunction with the isolation clip 2010. For example, the flexible portion 2025 (and/or other portions of the clip 2010) may be coated in the composition 800 as an alternative to, or in addition to, the use of damping apparatus 2030. The composition 800 may thus provide damping capabilities to the isolation clip 2010 as described herein, in both or either of an active or passive response to applied energy received by the clip 2010.

The examples provided above represent examples of a "passive" system for damping applied energy forces. However, it may be beneficial to be able to control the damping qualities of a construction material employing the damping apparatus or particles described herein. Many known particles are excellent shock absorbing materials and are amongst the most impact resistant substances known in the world today. Exemplary of the impact resistant particles are nested spheres of special metal compounds termed inorganic fullerene-like nanostructures, illustrated in FIG. 8. These particles, such as C60 (FIG. 8) are soccer-ball (or buckyball) shaped structures which may be configured to absorb, dampen, or disperse impact forces naturally based on their shape. For example, the carbon bonds 530 in C60 may allow some degree of flexion to the structure, which may allow the structure to compress upon receipt of an applied force, and then subsequently return to its initial shape.

The introduction of particles, such as C60, into a construction component may provide a means for changing, e.g., through a controlled response to electrical or magnetic stimulus, the physical and/or chemical properties of the component.

Figure 8A:
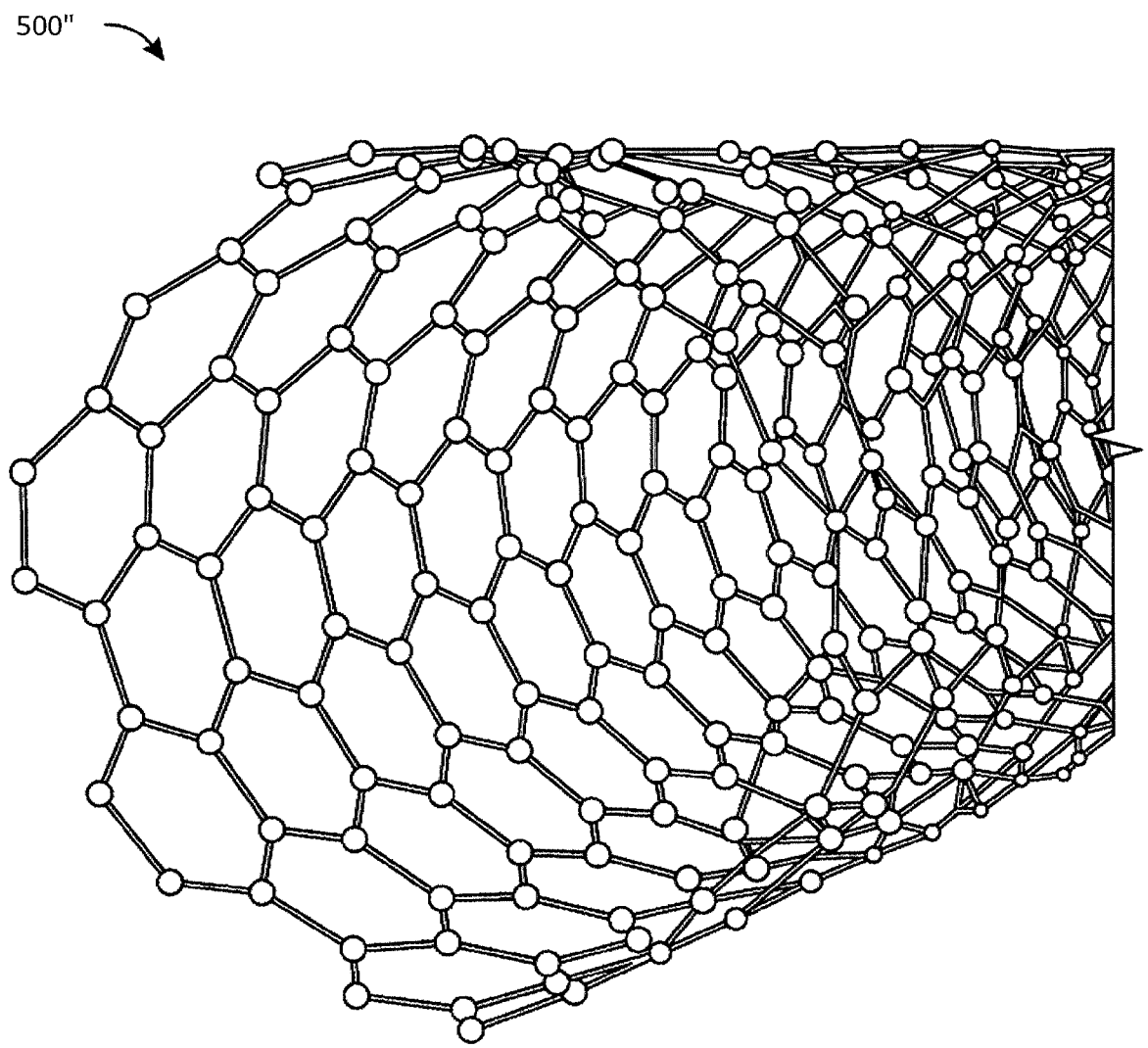
FIG. 8A is a perspective view of damping apparatus according to yet another embodiment of the invention.

As particles become very small yet large in number, particle systems will exhibit very large surface areas in relation to their mass. The interface between the particle and its environment can display properties that are markedly different from the bulk material. As particles get smaller and their size approaches molecular dimensions, the fundamental structural, electronic, and optical properties of some materials may begin to change giving rise to entirely new properties and sometimes quite unusual phenomena. Further examples of these particles include carbon nanotubes (FIG. 8A) with a theoretical strength many times that of steel and an electrical current density many hundreds of times greater than that of copper or silver. In addition, semiconductor quantum dots emit light at different wavelengths depending upon the nano-size, and some nano-powders may exhibit superparamagnetic properties.

Because of their unusual properties, these nanoparticles show promise in the field of construction components. The reduced size of the particles results in a dramatic increase in the surface-area-to-volume ratio compared to standard materials, which renders surface-related effects dominant.

These nanoparticles may optionally function in a "passive" manner as do the particles 200, 400, 500, and 500' described above. As shall be understood from the discussion herein, a "passive" construction component (e.g., incorporating particles 200, 400, 500 and/or 500') responds to an energy input, but that response is limited in some fashion—it responds by virtue of its structure alone but is not otherwise controllable, it may be turned on or off to allow for steady-state operation of the response (but not a controlled response) (which is discussed in further detail below), etc. However, the nanoparticles may optionally be able to function in a more "active" manner to specifically control the response of a particular construction material. An "active" smart construction component is configured to provide a controlled response to an energy input, usually through the incorporation of sensory technology which allows the for the monitoring of various aspects of the energy input and communication with the particles in order to modify the particles in such a way that the response of the particles (and therefore the construction material) is tailored to the respective energy input.

For example, in an embodiment, it may be preferable for the particle 500 to exhibit magnetic properties. When suspended in a composition (e.g., glass), the particles 500 may take the form of a ferrofluid, or a liquid (liquid, gel, etc.) that becomes magnetized in the presence of a magnetic field. As will be described in greater detail below, ferrofluidic compositions may allow for passive and/or dynamic response to an applied energy.

Ferrofluid is a unique material that acts like a magnetic solid and like a liquid. By incorporating particles having magnetic properties into a building composition, such as glass, the glass may be transformed into a ferrofluid. A ferrofluid is superparamagnetic, which is a property that may only exist at the nanoscale level, allowing the liquid to display magnetic tendencies only in the presence of a magnet. Thus, in order to transform a composition from a liquid to a ferrofluid, the damping apparatus must have magnetic properties.

Further, carbon-based 3D structures, such as C60 (500') or carbon nanotubes (500"), may be naturally paramagnetic, i.e., behaves like magnets in the presence of a magnetic field. Other particles, such as those manufactured from a polymer, may be coated in, or otherwise incorporate a magnetic material such as iron oxide. It may be desirable for the magnetic material to be coated in a surfactant to keep the magnetic structures from sticking together.

Absent a magnet, the magnetizable particles 500, 500' and/or 500" (hereinafter collectively referred to as 500) may function as described above. In other words, without a magnet, the particles 500 may simply compress or otherwise experience a change in state as a result of an applied energy, thus diffusing some of the applied energy away from the corresponding building material. In the presence of a magnetic (or electric) field, however, the particles may become even more effective dampers.

In one embodiment, a magnetic field (e.g., using a magnet or a magnetizable material, such as a thin strip of aluminum wrapped in a current-carrying coil, or other means known to those skilled in the art to apply a magnetic field) may be applied evenly at or near the areas of the building material comprising the particles in order to influence the orientation of the particles 500. This may be most useful in the case of a composition (e.g., paint, adhesive, coating, etc.) or other building component comprising nanotubes 500".

For example, a paint comprising a plurality of nanotubes may be applied to a wall. An applied energy may most frequently occur in a single direction across the wall (e.g., transversely). The magnetic field may be applied at or near the wall such that the nanotubes in the paint (or coating material) are oriented so as to transversely receive the applied energy across the wall. The applied energy may be at least partially diffused as described herein.

In another embodiment according to the same example, an applied energy may be received by the wall in one or more concentrated areas. In this case, a magnetic field may be activated only in the concentrated area(s) receiving the applied energy. Thus, multiple pieces of magnetizable material may be provided at or near the areas having the enhanced composition such that multiple magnetic fields may optionally be applied. The magnetic damping apparatus will thus be drawn to the magnetic field(s) activated at the desired locations. An increased concentration of the flexible damping apparatus may thus provide increased flexibility in the area of the magnetic fields. The magnetic field may additionally be operative for orienting the damping apparatus as described above.

The magnetic (or electric) field, in addition to orienting the nanotubes, may additionally allow for changes in the flexibility of the structure 500. For example, in some situations, it may be desirable for the structure 500 to be more flexible so as to dampen or disperse certain frequencies. In other situations, it may be desirable for the structure 500 to be less flexible so as to dampen or disperse other frequencies. The strength of the magnetic (or electric) field may thus be modified to provide the desired degree of flexibility of the structure 500. Therefore, The magnetic fields described above may generally be considered static or passive because the magnetic field, when applied, is steady state. In other words, the magnetic field may be turned on, or off, but the magnetic field may not vary, for example, over time, or in response to dynamic changes in the particle environment.

In still another embodiment, however, the building component comprising the particles (e.g., the nanostructures 500, 500', and/or 500"-referred to herein collectively as 500) may be configured for dynamic response to changes in the particle environment in real time and/or to address potential problems due to power amplification. One or more sensors (e.g., microphones, accelerometers, motion sensors, etc.) configured to sense and measure applied energy (e.g., sound waves, electromagnetic waves, seismic waves, changes in temperature and/or pressure, physical shock), and/or an object's resonating frequency may be applied in or around the building component comprising the particles 500. As the sensor(s) determines the amount of applied energy received by the component, the sensor(s) may transmit a signal (e.g., using a wireless connection over a network, Bluetooth, wired connection, or any other method whether now known or later developed) to a processor, which may be equipped with a program with instructions for evaluating the data received from the sensors and causing a force field to be applied to the particles to alter the properties of the particles, resulting in an ability to control the response of the building component to the applied energy. A stronger or weaker force field may be applied depending on the type of applied energy being sensed, and the relative strength of that energy.

As an applied energy, or force energy, is encountered by the building component, the sensors analyze the applied energy to ascertain the amplitude and frequency spectrum of the applied energy. A force field may be applied at or near the building component having particles dispersed therein to alter the properties of the particles (e.g., change in orientation, elasticity, etc. of the particles) in such a way that the particles experience a degree of physical displacement at controlled timing intervals based on the frequency spectrum of the applied energy. In one embodiment, the particles may actually experience controlled oscillations (e.g., physical displacement along a particular distance). The controlled response of the particles may result in a response force that is in a spread spectrum inverse waveform which may geometrically stabilize the building component(s) to avoid peak resonant frequencies which may damage the component(s). In other words, the controlled adjustments and corresponding response of the particles may result in a decrease in the amplitude of the applied energy by spreading the applied energy spectrum over time.

Figure 6:
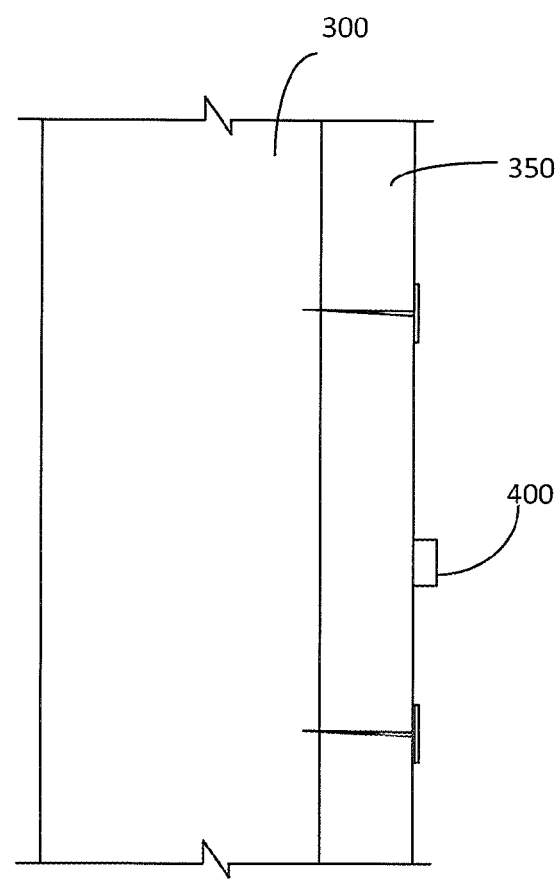
FIG. 6 is a side view of the construction components of FIG. 4.

For example, in one embodiment illustrated in FIG. 6, one or more sensors may be placed at or near a wall having wallpaper 1000' applied which comprises responsive particle fibers 1010' which may detect sound waves. During certain hours of the day the sensors may register higher decibels of sound waves being received by and transmitted across the wall; conversely, during the evening hours, the sensors may register lower decibels of sound waves. In response, the amount of current pushed to the magnetizable materials (e.g., the particle fibers 1010) may be greater during the day in order to alter the properties of the particle fibers 1010 to block out the unwanted noise than that required during the night. Fibers 1010 woven into textiles such as curtains 1000 (FIG. 11) may also be configured to function as damping apparatus, configured to disperse applied energy received by the curtains 1000.

In another example, a sensor distributed at or near a building component may detect the natural resonant frequency of a building component. A second sensor (or the same sensor) may detect the frequency of applied energy upon the component. If the second sensor detects that the frequency of the applied energy is the same as the natural resonant frequency of the component, a magnetic field may be applied (or removed, as the case may be) at or near the component in order to alter the properties of the particles such that the apparatus may dampen (or alter) the frequency spectrum of the applied energy as received by the substrate in order to avoid power amplification and possible destruction of the building component (or structure attached to the component). This ability to tune and detune the particles in real-time in response to a sensed frequency of a building component or energy applied to a building component may allow for supremely customizable products containing the particles. It shall additionally be understood that the resonant frequency of the building component may be altered by the mass or a surface which may be affixed to the component.

In still another embodiment, the particles 500 or 500' may be electrically active, and incorporated into a composition which may act as an electrically insulating fluid so as to form an electrorheological composition. Applying an electric field (e.g., flux lines) at or near the composition to influence the particles may allow for a change in the apparent viscosity or the durometer of the composition material. An electric field may be applied at or near the composition using known techniques. For example, conducting plates may be provided parallel to each other (e.g., at each side of a wall having the composition applied thereto). A voltage may be maintained between the plates by passing current through the plates. The apparent change in the viscosity of the composition may be directly dependent on the strength of the applied electric field. Thus, as the strength of the applied electric field is increased and/or decreased, the consistency of the composition may transition from that of a more elastic "gel" to a less elastic "gel," and vice versa.

The change in viscosity or durometer of a material may occur over very small time increments, e.g., milliseconds, making the electrorheological composition especially useful in conjunction with sensors. For example, in one embodiment, the electrorheological composition may be applied to a window (e.g., in the form of an adhesive or other type of coating). The conducting plates may optionally be opposing sides of the sash, if the sash is constructed of, for example, aluminum. Alternately, conducting plates may be provided parallel to each other on either side of the sash. The window pane(s) may be placed between the plates. One or more sensors may be placed at or near the window pane(s) to measure applied energy to the window pane(s). If the sensor senses an applied energy over a threshold value, the sensor may transmit a signal to cause an electric field to be applied to the plates. In response, the composition (via the particles) may become stiffer in order to reduce the effects of the applied energy. Additional material property changes can be assisted with micro-particles or structures constructed of smart material alloys (e.g., nitinol).

While reference is made herein to magnetic fields and electric fields, it shall be understood that the magnetic fields and electric fields may additionally or alternately be other types of force fields which may be used to alter the properties of the particles. For example, force fields such as subsonic, ultrasonic, electromagnetic, or photonic fields may be applied (using methods known by those skilled in the art) in conjunction with the compositions having particles.

In still yet another embodiment, the parties may take the form of piezo elements. In response to an applied force, the piezo element may become deformed. For example, when the piezo elements are bent in one direction due to an applied force, a force field (as described above) may be activated (e.g., via a signal from a sensor) to send electric power to the piezo elements to bend in the other direction. In this way, the response of the piezo element may help to reduce the disruption to the building component.

Figure 10A:
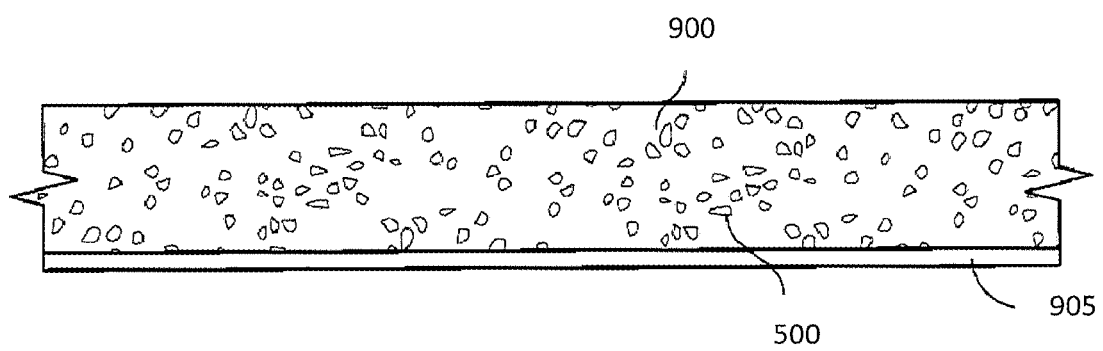
FIG. 10A is a perspective view of a composition having a backing with a plurality of damping apparatus dispersed throughout according to another embodiment of the invention.

The particles may alternately (or even additionally) be provided in a backing, such as is illustrated in FIG. 10A (illustrating a backing 900 with adhesive 905 on one or both sides. One example of an adhesive with a backing is a double-sided foam tape. Double-sided foam tape includes a principal portion (e.g., backing) 900 consisting of foam (or other similar material) and adhesive 905 is applied to opposing sides of the principal portion 900. Any of the particles 500 described herein (or other appropriate 3D structure) may be incorporated into the backing 900. Further, the particles provided in the backing may be configured for dynamically controlled response as a reaction to a force field, as discussed above. The backing may be applied to various construction materials (e.g., floors, windows, wall panels, insulation panels, etc.) for increasing their damping capabilities as described herein.

Variations of arrangements including combinations of hybrid configurations of smart-materials such as nickel titanium or nitonol can be combined to perform dynamic response by utilizing the properties of shape-memory alloys (SMAs). SMAs and other smart-materials may exhibit properties that allow the molecular alignment to change in physical state (i.e. relative molecular position) based on variations in energy levels experienced by the SMA material. For example, in the form of a wire strand, nitonol varies in length based on the temperature of the SMA itself. In the case of conductive smart-materials such as nitonol, an electric current can be induced into the smart-material/SMA in order to alter the temperature of the SMA—causing the length of the wire to vary based on changes in the wattage dissipated across the SMA wire within the composition.

Variations of state, position, and structure within SMAs and smart-materials can be exploited to embed SMA wires, pellets, or thin-film strips within the composition. By varying the SMA's density, position, and relative placement between companion nanoparticles the effective resonant mode of the composition can be changed based on external stimulus as a controlled response to achieve anti-resonant damping.

For example, SMA pellets can be dispersed within a mixture of nanoparticles to create a composition layer which may have various properties (e.g., fluid, gel, etc.) that can be altered in dimension based on externally induced waveforms. The composition layer may be positioned between two layers of, for example, plywood which may be equipped with conductive strips or plates. Direct contact of the external response waveforms or force fields can be conductive as direct current (DC) or low-frequency (as shown via contacts for DC drive currents or low frequency AC). Indirect induced waveforms can also be used to capacitively couple electrical energy through the SMA pellets using strategically selected high-frequency AC waveforms which do not require direct electrical contract. In other words, a nearby field of energy can be utilized to vary the anti-resonant damping mode of the composition without any direct contact to the composition itself.

Smart-materials can be somewhat slow to respond due to the thermal mass or other physical properties that can slow response time. This means that there is a limit to the response time (or frequency) of the molecular changes in the smart-material (or SMA) itself. One method of obtaining increased performance is to utilize a harmonic frequency byproduct (based on the changes in the physical properties of the SMA material) to assist in the anti-resonant damping process. For example, a change in SMA structure may be possible in 100's of milliseconds occurring in a repetitive pattern at a fundamental frequency (or rate of change) altering the SMA structural alignment. A resonant byproduct of this movement-pattern can be realized by strategically using the 3rd (or 5th, etc.) harmonic with notable energy that can be used to assist in the anti-resonant tuning and detuning of the composition for damping. By utilizing a higher frequency harmonic as the controlled response damping, you can achieve this result by providing a much lower rate of change to the molecular smart-material/SMA and achieve higher frequency movements in the substrate structure for damping. The net result allows slow movements within the composition to provide damping to higher frequency vibrations which in turn enhance damping performance of the composition.

As shall thus be understood, the disclosed technology is further directed to construction components configured to detect energy application and respond accordingly. Self-sensing and self-diagnosing are properties by which a material can sense its own conditions such as stress, strain, damage, temperature, and so on. A self-sensing construction component may have the ability to sense its own deformation thereby allowing the component to self-monitor its own health. Strain and damage sensing in a construction material may be achieved through, for example, detecting a change in electrical resistivity. One major advantage with the self-sensing composites is the possibility to achieve sensing as well as altering the behavior of construction components simultaneously, as is described in greater detail below.

The technology enables sensor data through the use of smart particle technology to be taken anywhere, at any time during any activity of interest. The disclosed technology is useful in all areas of construction components, for example with sensors and actuators distributed throughout and especially in places that observe component state information, such as displacement during large energy applications (for example, earthquakes and hail impacts). State information refers to multiple parameters and features of interest. For example, energy received by the building foundation or energy applied to the roof from a hail event. Furthermore, this information can be processed over time to estimate more complex component-state information such as deformation or fracture of the component.

An actuator embedded within or adhered to a construction component may facilitate movement or control of a mechanism or system. An actuator requires a control signal and a source of energy. When the control signal is received, the actuator responds by converting the energy into mechanical motion. Nanoactuators offer speed, high resolution, range, repeatability, robustness against disturbances and the ability to sense as well as actuate. The exceptional electrical and mechanical properties of, for example, carbon nanotubes have made them alternatives to the traditional electrical actuators for both microscopic and macroscopic applications. Carbon nanotubes (e.g., FIG. 8A) are very good conductors of both electricity and heat, and they are also very strong and elastic molecules in certain directions. Electromechanical actuators based on sheets of single-walled carbon nanotubes have been shown to generate considerable force and higher strains than high-modulus ferroelectrics. Unlike conventional ferroelectric actuators, low operating voltages of a few volts can generate large actuator strains. Bimorph cantilever actuators comprised of two strips of single-walled nanotube sheets have been shown to allow the device to respond differently depending upon the difference in the electrically induced expansion of opposite actuator electrodes.

Nanosensors are sensors that utilize and detect nanoscale phenomenon and that have the potential for a range of different applications due to their high sensitivity, installation in the form of arrays, low power and autonomous systems and are capable of batch processing at a low cost. Nanosensors work by calculating and measuring displacement, dislocations, concentration, volume, acceleration, external forces pressure or temperature of discrete areas of a construction component. Nanosensors may change electrical conductivity, when the nanotubes flex. This change in conductivity is proportional to nanotube mechanical shape changing. Nanosensors can also sense and signal, acting as wireless nanoantennas. Because they are so small, nanosensors can collect information from millions of different points. External devices can then integrate the data to generate detailed maps showing the slightest changes in light, displacement, vibration, electrical currents, magnetic fields, chemical concentrations and other environmental conditions.

Microsenors are, for example, very small sensors with physical dimensions in the submicrometer to millimeter range that convert a nonelectrical physical or chemical quantity, such as pressure, acceleration, temperature, or gas concentration, into an electrical signal. Mechanical microsensors measure a wide range of mechanical properties, including force, pressure, displacement, acceleration, rotation, and mass flow.

Energy storage devices and power generators that supply power to construction components need flexibility and material compatibility. Supercapacitors have a high power density, a fast charging/discharging speed, and cycle durability. In case of the construction components, flexible materials are preferable to the possibility of high deformability. The excellent electrochemical properties, electrical conductivity, large surface area, and mechanical softness of carbon nanotubes make them appropriate for the electrodes and current collectors of construction components. Exemplary of energy storage is the dipping of a construction components into a carbon nanotube dispersed ink to coat the component carbon nanotube random networks.

Through the use of certain assumptions, data fusion and adaptive algorithm techniques, the disclosed technology is capable of losing some fraction of sensors on or within the construction component, and yet perform the desired function. In this sense, a construction component relies upon a set of similar and related particle sensors that respond in a well ordered distribution. For example, multiple sensor particles embedded within a building foundation may deform in a particular pattern when the foundation is impacted by an earthquake. An algorithm then preferably operates on the data relayed through, for example, MEMs antennas or nanoantennas that represents discrete displacements.

In some embodiments, the processing of the particle sensor data takes place on a centralized processor or a set of distributed processors placed throughout or adjacent the component and working in unison to compute the relevant features of the sensor data and advance the analysis of the outcomes of the energy application on the component configuration. In the case of sensor processing, the disclosed technology is capable of losing some fraction of the sensors and communication links and yet will continue to provide results equal to or of minor degraded fidelity than if the entire construction component remained intact. In some embodiments the sensor particles and actuator particles can be configured as semiconductor junctions and thereby be utilized in a logic configuration that allows the particles to process an algorithm without the need of an external processing unit. The particles themselves can be configured to perform logical algorithm execution, communication, and memory functions.

Figure 1:
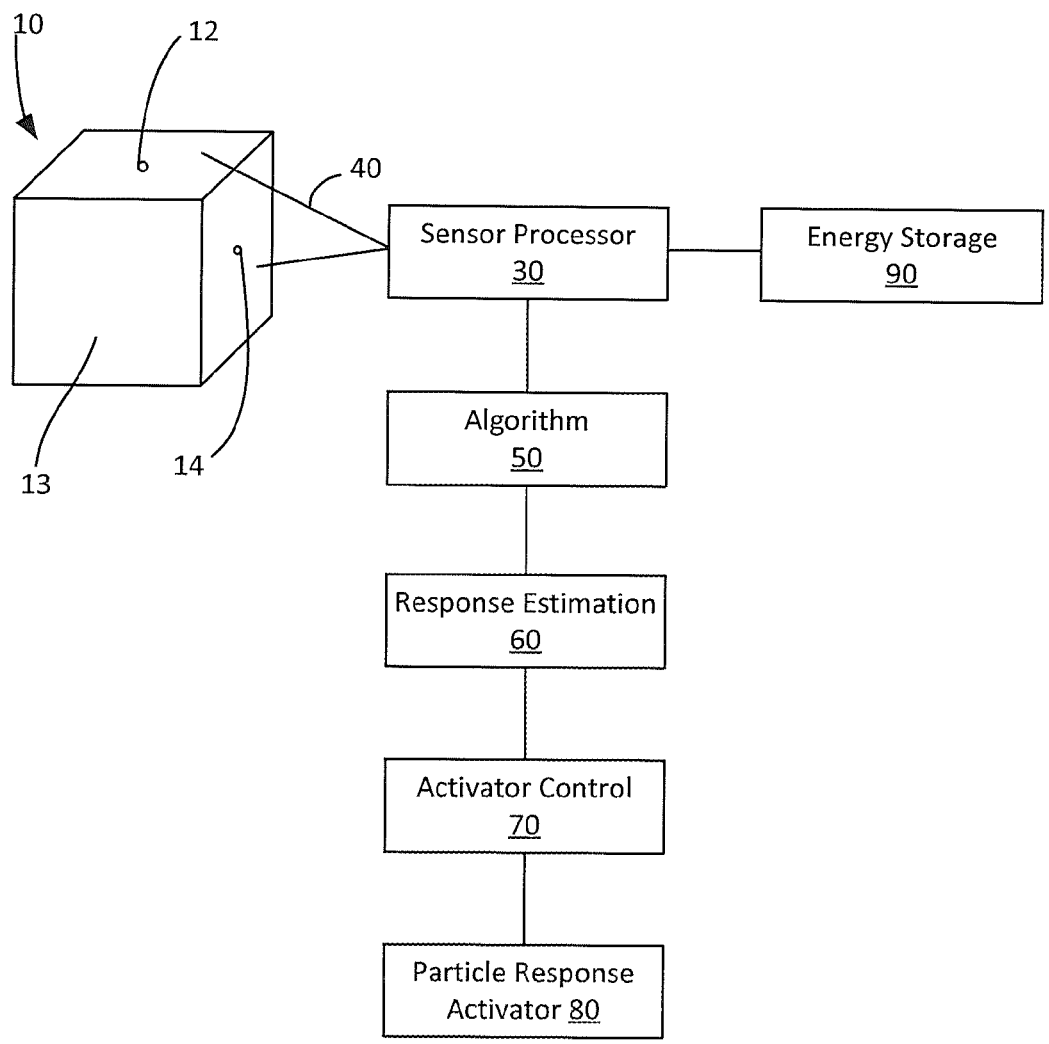
FIG. 1 is a process flow diagram for a system for controlling the response to the application of energy to a construction component.

FIG. 1 reveals a conventional hardware configuration for detection of a generic construction component 10 undergoing the application of energy. As shown, particle sensors 12, 13, 14 are placed at specific locations within or upon the construction component to measure, for example, deflection and flexure. It should be understood that the construction component will have many more than three particle sensors; however, for ease of discussion a total of three particle sensors are represented. This displacement data can then be transmitted to a computer implemented algorithm 50 which provides data to a response estimation module 60 which in turn transmits data to an actuator control module 70 which in turn actuates the particles 12, 13, 14 to respond to the energy applied to the construction component. The distributed particles 12, 13, 14 can achieve high performance due to the high level of dispersal upon, or throughout, the construction component 10.

Figure 2:
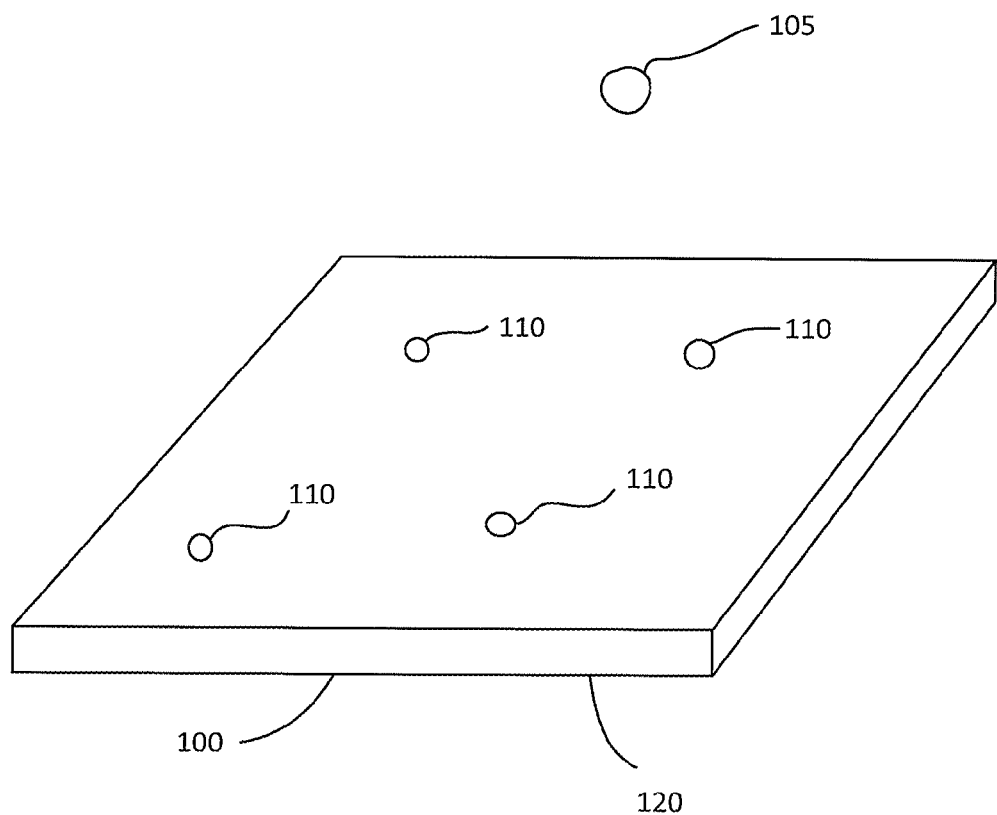
FIG. 2 is a perspective view of an embodiment of a construction component detailing embodiments of the present invention.

FIG. 2 reveals an exemplary construction component 100 with a hardware configuration for detection of roof system hail stone 105 impacts according to various embodiments of the present invention. As depicted, a plurality of particles 110 are placed throughout the shingle 100 to detect flexure and deformation due to a hail stone 105 strike. For example, particles 110 capable of sensing deformation are either integrated into the shingle 100 or applied to the backside 120 (or the front side) of the shingle.

In some embodiments, deformation voltage potentials are sensed by voltage sensors at the surface of the construction component. In some embodiments changes in shingle 100 deformation is sensed using compliant piezoelectric bands (strain sensors). The plurality of sensors, in combination with the computer implemented process described below, yield data that provide a detailed description of the deformation of the shingles 100.

This data may then be used to distinguish responses to the applied energy, such as flexure of the roof shingle 100 due to wind or hail strike. The data may also be used to analyze the subject's mechanical integrity using unique processing techniques specific to each construction component. The data from the plurality of sensor particles 110 may also be utilized to detect continuity, fracture, separation of the monolithic configuration of a building foundation, or stress changes due to shifts in building weight. This data can also be used to control a variety of mechanical actuators that may stiffen the roofing structure or the foundation.

As shown in FIG. 1, the algorithm module 50 implements a spatially-distributed infrastructure, which may be the Proto™ spatial computing language that supports data flow and shared processing activity among the discrete particle sensors 12-14. In cases where the system is used in conjunction with actuators, the outputs of response estimation module 60 in turn is relayed to the actuator control module 70. In some embodiments, a particle response actuator module 80 is implemented to communicate with other modules such as the energy storage module 90.

The interface to the actuators and their preferred response during an energy application can be defined in software and uploaded to the system so the particle response activator 80 can activate and control the particles in the most effective way possible. The adaptive nature of the software design also allows for real-time optimization of the control algorithm using feedback taken from the construction component.

Widespread distribution of the particle sensors 12-14 throughout the construction component 10 allows for a robust, compliant solution for rigidly-affixed sensors. In some embodiments, the employed sensors may be MEMS or nanomaterials. FIG. 1 further reveals a plurality of sensors 12-14 are placed and distributed throughout the construction component and especially in places that experience a change of state during an energy application such as hail storm or an earthquake. Each sensor 12-14 is interrogated by a respective sensor processor 30. The particle sensors 12-14 sense energy application by integrated transducers that may include but are not limited to accelerometers, thermal sensors, optical transmissivity/reflectance, pressure, and/or mechanical strain, and generate related data.

Sensors 12-14 transmit data to the processor 30 and related hardware and interfaces for processing the sensed signal from the sensor 12-14 and outputting the processed signal to the sensor processor 30 via communication channels 40. In some embodiments, each sensor processor 30 is configured to receive construction component information locally from one or more particles 12-14; to utilize the information to determine a component status by one or more sensors; and to transmit data to the sensor processor 30. The processed signal includes data on the construction component such as deformation at each sensor location.

The ability to know the location of each sensor and its orientation to the construction component as a whole provides accurate orientation information for the entire construction component. For example, if a sensor is located on the back surface of a roofing shingle to measure displacement caused by hail, the increase in strain would correspond to the impact of the hail. In some embodiments, at least one sensor 12-14 utilizes the local surface shape information received from the sensor to generate one overall model of a surface shape of the entire surface of the construction component.

In some embodiments, the algorithm 50, is generated automatically from a specification of collective behavior, such as from geometry and information flow. For example, this approach may be embodied by specifying collective operations in the Proto programming language. A program thus specified is a functional composition of mathematical operations on fields over geometrically dispersed areas, such as the surface of the construction component. Established transformation methods embodied in the MIT Proto™ compiler and virtual machine are then capable of transforming any Proto language program into a distributed algorithm 50 that approximates the configuration of the construction component.

This may represent a localized area such as the top surface of a shingle or the entire roof system. In preferred embodiments, the construction component 10 includes the actuation mechanisms integrated with the suite of sensors. A response estimation module 60 in communication with an actuator control module 70 properly synchronizes the actuators to achieve the desired result. Through the many particle sensors the system is capable of identifying these changes and modifying the timing and force levels of the actuators to, for example, increase or decrease shingle stiffness during a hail storm event.

In another embodiment, the disclosed technology uses adaptive processing to tune the construction component to control a system of actuators and sensors. The calibration data taken after the subject initializes the system provides a baseline for the model to use, however, the model may be updated throughout usage of the system. If adequate information is available, that feedback is used to optimize the performance of the external device to maximize its value to the construction component.

In addition, nanomaterials offer unique properties when used as electrodes and electrolytes in a range of energy devices. For these reasons, they are becoming increasingly important in areas such as electrochemical sensing, energy harvesting, and storage.

Figure 11:
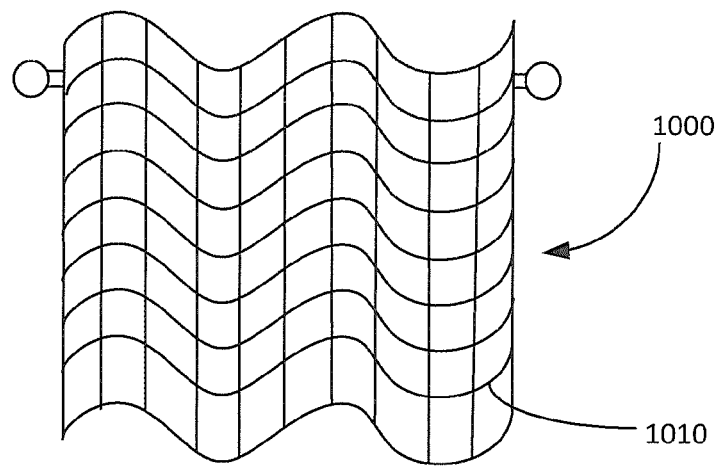
FIG. 11 is a perspective view of a textile having a plurality of fiber micro cables woven therein according to one embodiment of the invention.
Figure 12:
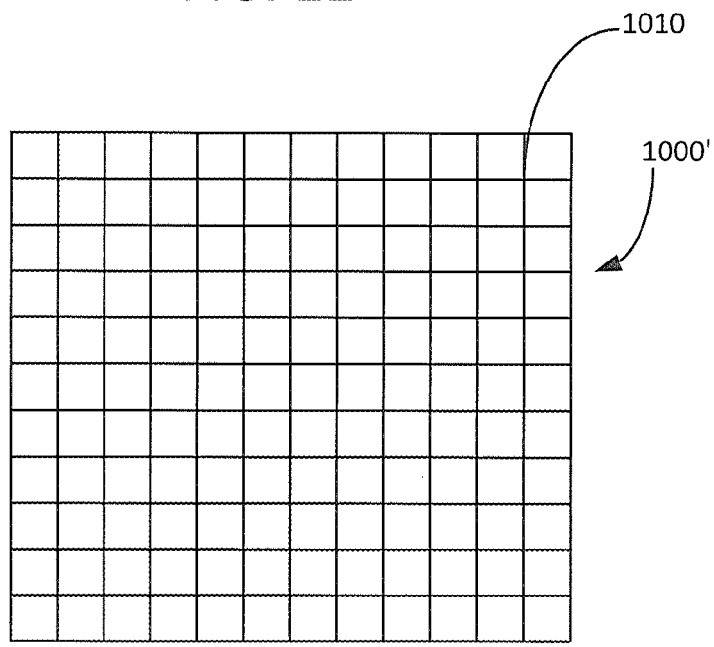
FIG. 12 is a perspective view of a textile having a plurality of fiber micro cables woven therein according to another embodiment of the invention.

Triboelectric nanogenerators use a combination of the triboelectric effect and electrostatic induction to generate a small amount of electrical power from mechanical motion such as rotation, sliding or vibration. Fiber-based triboelectric nanogenerators capture the energy created when certain materials become electrically charged after they come into moving contact with a different material. Sunlight-harvesting can also be performed with the use of solar cells fabricated from lightweight polymer fibers into micro cables that are woven via a shuttle-flying process with fiber-based triboelectric nanogenerators. A single layer of fabric having roughly 320 µm thickness can be integrated into various cloths, curtains, tents and so on. FIGS. 11 and 12 illustrate a curtain and a portion of wallpaper, respectively, each having micro cables 1010 and 1010', respectively, integrated therein. For example, a hybrid power textile, fabricated with a size of 4 cm by 5 cm, can charge a 2 mF commercial capacitor up to 2 V in 1 min under ambient sunlight in the presence of mechanical excitation, such as human motion and wind blowing. The textile could continuously power an electronic watch, directly charge a cell phone and power other systems within the general vicinity of the textile (e.g., lamps, overhead lights, etc.).

It shall be understood that each of the damping apparatus described herein may be arranged as a system configured to work together to provide increased controlled response and/or predictive capabilities across long distances. A plurality of sensors and control elements (e.g., damping apparatus 200, 400, 500, 500', 500", 800, 1010, 1010', etc.) may function through a distributed network to provide controlled response and/or predictive capabilities in order to tune or detune resonant frequencies in order to overcome adverse effects of the substrates or building materials linked to such sensors and control elements. For example, one or more sensors in a building may send signals to multiple building components comprising control elements for responding to several different sources of applied energy. For example, a sensor may send a signal to a reactive paint composition on the walls in response to sensing of sound waves to prevent transfer of those waves to another room. At the same time, a sensor may be programmed to sense that the sounds are coming from children in the room. The sensor may thus send a signal to floor components incorporating damping apparatus to soften the floor in case the child falls. In other words, all building materials and components may incorporate damping apparatus and sensors as described herein, which may all be connected through a network to send and receive information from and to the sensors and apparatus, as appropriate, in order to provide controlled response and/or predictive capabilities throughout the entire system.

Further, a system may be connected over a network (WAN, LAN, etc.) in order to provide a meshed network of clustered sensor data nodes distributed over distances that can vary from nano-measurements to miles, or even thousands of miles. The clustered sensor data network may be intended to provide a composite prospective of data analytics to the cloud and redistribute dynamic controlled response tokens in order to stabilize and/or achieve desired effects of the materials attached to the sensor data network nodes. Each node may include a sensor and/or control point (e.g., damping apparatus and/or composition) and may optionally provide functionality to both sense and control response through the same node.

Figure 15:
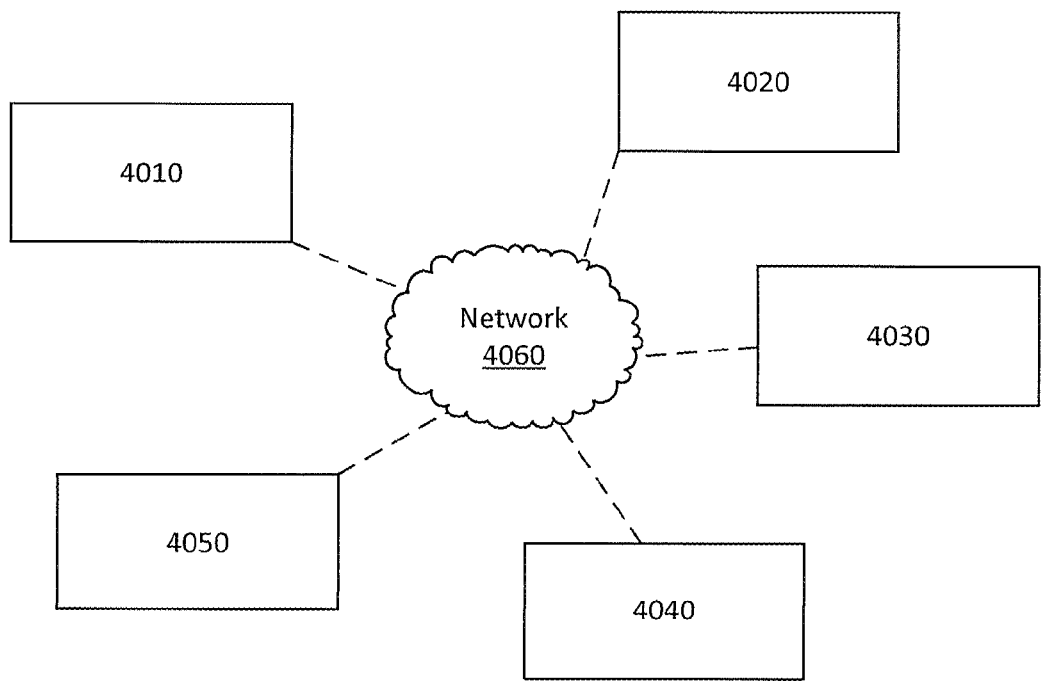
FIG. 15 is a concept diagram illustrating an implementation of the invention according to one embodiment.

In other words, nodes (e.g., sensors and/or damping apparatus) may be distributed across a whole neighborhood, city, county, state, country, or multiple countries. FIG. 15 illustrates a system 4000 having a plurality of nodes 4010, 4020, 4030, 4040, 4050, which may each represent one or more nodes at various locations. Each of these nodes 4010, 4020, etc. may provide information to, and receive information from, the network 4060. The ability to provide information to, and receive information from, the network allows the nodes in each of the respective locations to take action, if needed, based on current events. Consider, for example, an earthquake. Nodes at various locations (e.g., the epicenter and distributed outwards therefrom) may be able to provide information about the seismic waves travelling across long distances, which may help seismologists study earthquakes. Further, nodes at the epicenter may provide data to the network which may be received by nodes at a distance away, which can cause the nodes (e.g., damping apparatus) to predictively react to the earthquake by changing the flexibility, orientation, etc. of the damping apparatus in order to prevent structural damage to the building.

Still further, the network nodes may provide primary and/or supplemental information for the purpose of sensing and/or providing dynamic control to feed a distributed network such as the Internet of Things (IoT). Supplemental information from these nodes can be tokenized and/or encapsulated within data frames to provide seamless interface and compatibility to and from legacy network systems as well as systems yet to be invented. The purpose is therefore to provide both backward and forward compatibility regardless of currently employed intercommunication techniques.

Many different arrangements of the described invention are possible without departing from the spirit and scope of the present invention. Embodiments of the present invention are described herein with the intent to be illustrative rather than restrictive. Alternative embodiments will become apparent to those skilled in the art that do not depart from its scope. A skilled artisan may develop alternative means of implementing the disclosed improvements without departing from the scope of the present invention.

Further, it will be understood that certain features and subcombinations are of utility and may be employed without reference to other features and subcombinations and are contemplated within the scope of the claims. Not all steps listed in the various figures and description need to be carried out in the specific order described. The description should not be restricted to the specific described embodiments.

The invention claimed is:

1. An isolation clip, comprising:
    an outer bracket having a generally U-shaped configuration thereby defining a first channel;
    an inner bracket having a generally U-shaped configuration thereby defining a second channel, wherein the inner bracket is configured to fit within the first channel; and
    a set of magnets situated between the inner bracket and the outer bracket;
    wherein:
        the inner bracket has a maximum width less than a maximum width of the outer bracket;
        the inner bracket is configured to receive a stud into the second channel;
        the outer bracket is configured to be secured to a piece of drywall;
        the resilient member is configured to flex upon receipt of an impact force upon the isolation clip; and
        a first magnet of the set of magnets is situated at the outer bracket and a second magnet of the set of magnets is situated at the inner bracket, the magnets being positioned with identical poles facing toward each other to cause a repelling effect.

2. The isolation clip of claim 1, wherein the impact force is at least one of a physical impact and a sound wave.

3. The isolation clip of claim 1, wherein the inner bracket comprises a plurality of resilient projections extending into the second channel.

4. The isolation clip of claim 3, wherein the resilient projections are configured to flex upon receipt of the impact force upon the isolation clip.

5. The isolation clip of claim 1, further comprising a sensor for measuring a characteristic of an impact received upon the isolation clip.

6. An isolation clip, comprising:
    an outer bracket, comprising:
        an outer contact surface;
        an inner contact surface; and
        a respective arm extending upwardly from opposing sides of the inner contact surface, each arm having a free hook end;
        wherein a first channel is defined between the inner contact surface and the respective arms;
    an inner bracket, comprising:
        a base, the base having a maximum width less than a maximum width of the inner contact surface of the outer bracket;
        a respective arm extending upwardly from opposing sides of the base, each arm having a tapered end portion; and
        a resilient member secured to an outer surface of the base in a direction opposite the arms;
        wherein a second channel is defined between the base and the respective arms extending upwardly from the base;
    wherein the inner bracket mates with the outer bracket such that:
        the respective arms of the inner bracket are substantially adjacent the respective arms of the outer bracket;
        the tapered end portions of the respective arms of the inner bracket are received into the respective hook ends of the respective arms of the outer bracket; and
        the resilient member is substantially adjacent the inner contact surface.

7. The isolation clip of claim 6, further comprising a sensor for measuring a characteristic of an impact received upon the isolation clip.

8. The isolation clip of claim 6, wherein the resilient member is curved.

9. The isolation clip of claim 6, further comprising a plurality of resilient projections extending from the base into the second channel.

10. The isolation clip of claim 9, wherein the resilient projections are rubber.

11. The isolation clip of claim 6, wherein the resilient member is rubber.

12. The isolation clip of claim 6, wherein the resilient member is a spring.

13. The isolation clip of claim 6, wherein the outer contact surface is curved thereby defining a contact point.

14. The isolation clip of claim 6, wherein the outer contact surface further comprises at least one zipper channel.

15. The isolation clip of claim 6, wherein the resilient member is configured to flex upon receipt of an impact force upon the isolation clip.

16. The isolation clip of claim 15, further comprising a plurality of resilient projections extending from the base into the second channel.

17. The isolation clip of claim 16, wherein the resilient projections are configured to flex upon receipt of the impact force upon the isolation clip.

18. The isolation clip of claim 15, wherein the impact is at least one of a physical impact and a sound wave.

\* \* \* \* \*